United States Patent
Swaminathan et al.

(10) Patent No.: US 7,705,423 B2
(45) Date of Patent: Apr. 27, 2010

(54) DEVICE HAVING AN ARRAY OF EMBEDDED CAPACITORS FOR POWER DELIVERY AND DECOUPLING OF HIGH SPEED INPUT/OUTPUT CIRCUITRY OF AN INTEGRATED CIRCUIT

(75) Inventors: Madhavan Swaminathan, Marrietta, GA (US); Ege Engin, Atlanta, GA (US); Prathap Muthana, Atlanta, GA (US); Krishna Srinivasan, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 200 days.

(21) Appl. No.: 11/523,270

(22) Filed: Sep. 19, 2006

(65) Prior Publication Data
US 2007/0102811 A1 May 10, 2007

Related U.S. Application Data

(60) Provisional application No. 60/729,425, filed on Oct. 21, 2005.

(51) Int. Cl.
*H01L 29/00* (2006.01)

(52) U.S. Cl. ................. 257/532; 257/312; 257/700; 257/723; 257/724; 257/924; 257/E23.062; 257/E23.07; 257/E23.079

(58) Field of Classification Search ............... 361/306.3; 257/312, 532, 700, 723, 724, 924, E23.062, 257/E23.07, E23.079
See application file for complete search history.

(56) References Cited

U.S. PATENT DOCUMENTS

| | | |
|---|---|---|
| 5,010,641 A | 4/1991 | Sisler |
| 5,079,069 A | 1/1992 | Howard et al. |
| 5,155,655 A | 10/1992 | Howard et al. |
| 5,161,086 A | 11/1992 | Howard et al. |
| 5,162,977 A | 11/1992 | Paurus et al. |
| 5,428,499 A | 6/1995 | Szerlip et al. |
| 5,469,324 A | 11/1995 | Henderson et al. |
| 5,504,993 A | 4/1996 | Szerlip et al. |
| 5,870,274 A | 2/1999 | Lucas |
| 6,214,445 B1 | 4/2001 | Kanbe et al. |
| 6,215,372 B1 | 4/2001 | Novak |
| 6,317,023 B1 | 11/2001 | Felten |
| 6,346,743 B1 | 2/2002 | Figueroa et al. |
| 6,407,929 B1 | 6/2002 | Hale et al. |
| 6,611,419 B1 | 8/2003 | Chakravorty |
| 2002/0054471 A1 | 5/2002 | Adae-Amoakoh et al. |
| 2002/0134581 A1 | 9/2002 | Figueroa et al. |
| 2002/0181185 A1* | 12/2002 | Kabumoto et al. ....... 361/306.3 |

(Continued)

OTHER PUBLICATIONS

U.S. Appl. No. 10/801,326, filed Mar. 16, 2004, Borland et al.

(Continued)

*Primary Examiner*—Andy Huynh

(57) ABSTRACT

One embodiment of the present invention provides advice for providing a low noise power supply package to an integrated circuit comprising a semiconductor die, input/output power supply terminals, and an array of embedded ceramic capacitors selected from discrete, planar and combinations thereof wherein said capacitors are placed in the locations selected from within the perimeter of the shadow of the semiconductor die, partially within the perimeter of the shadow of the semiconductor die, near the perimeter of the shadow of the semiconductor die, and combinations thereof.

13 Claims, 31 Drawing Sheets

U.S. PATENT DOCUMENTS

2004/0012938 A1    1/2004   Sylvester et al.
2004/0023381 A1    2/2004   Galer et al.
2004/0099999 A1    5/2004   Borland
2004/0233611 A1   11/2004   Borland

OTHER PUBLICATIONS

U.S. Appl. No. 10/801,257, filed Mar. 16, 2004, Borland et al.

Muthana, Prathap et al., Design, Modeling and Characterization of Embedded Capacitor Networks for Mid-frequency Decoupling in Semiconductor Systems, 2005 International Symposium on Electromagnetic Compatibility, Aug. 8, 2005, pp. 638-643, vol. 2, IEEE.

Wan, Lixi et al., Design, Simulation and Measurement Techniques for Embedded Decoupling Capacitors in Multi-GHz Packages/PCBs, 2005 6th International Conference on Electronic Packaging Technology, Aug. 30, 2005, pp. 1-5, IEEE.

Chahal, Premjeet et al., A Novel Integrated Decoupling Capacitator for MCM-L Technology, 1996 Electronic Component and Technology Conference, May 28, 1996, pp. 125-132, IEEE.

Wan, Lixi et al., Embedded Decoupling Capacitor Performance in High Speed Circuits, 2005 Electronic Components and Technology Conference, May 31, 2005, pp. 1617-1622, IEEE.

European Search Report dated Jul. 7, 2009, European Application No. 06020934.

* cited by examiner

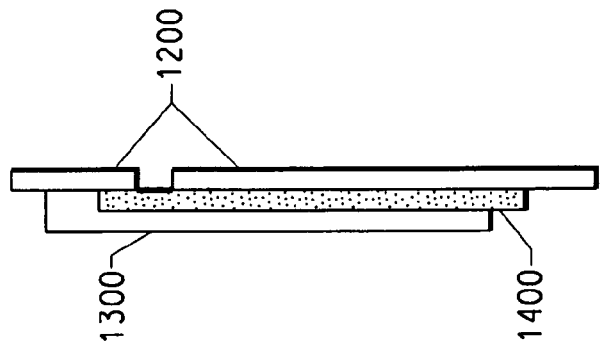
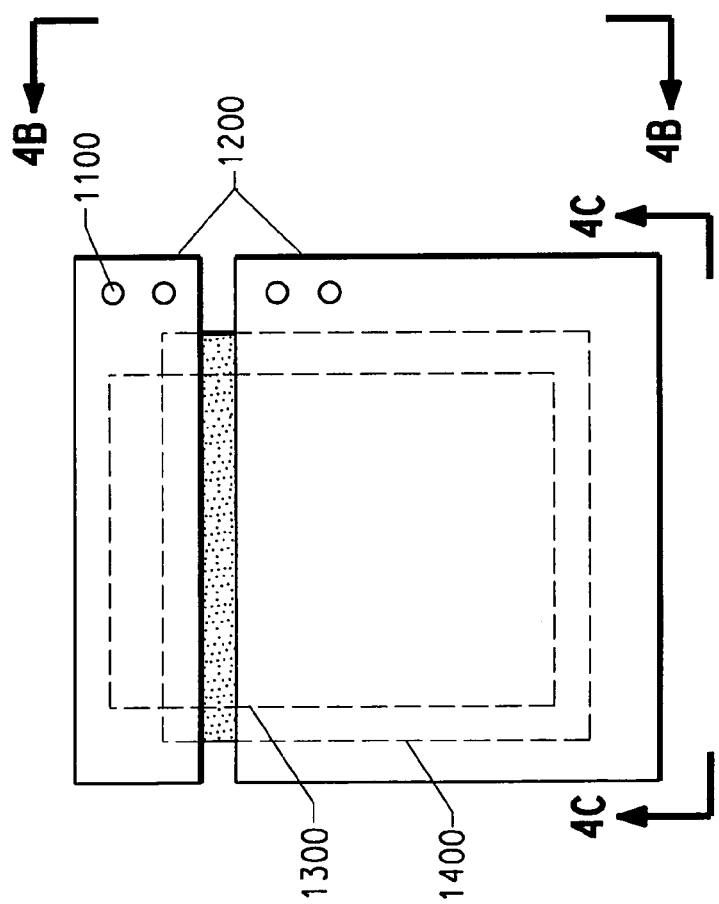 
FIG. 4B
FIG. 4A
FIG. 4C

Capacitor Parameters without Vias

| | Type | Capacitance | ESR (Resistance) | ESL Inductance |
|---|---|---|---|---|
| 1 mm | A | Capacitor 1 | 1.26nF | 36 mohms | 48pH |
| | B | Capacitor 2 | 1.17nF | 50 mohms | 47.3pH |
| | C | Capacitor 3 | 1.63nF | 34 mohms | 41.6pH |
| 2 mm | A | Capacitor 4 | 5.15nF | 8 mohms | 33.7pH |
| | B | Capacitor 5 | 5.16nF | 10.7 mohms | 35.07pH |
| | C | Capacitor 6 | 6.16nF | 10.7 mohms | 35.48pH |
| 3 mm | A | Capacitor 9 | 10.6nF | 7.9 mohms | 35.44pH |
| | B | Capacitor 8 | 11nF | 10 mohms | 40pH |
| | C | Capacitor 7 | 13.6nF | 8.9 mohms | 33.8pH |

Type A    Type B    Type C

Capacitor Parameters with Vias

| Type | | Capacitance | ESR (Resistance) | ESL Inductance |
|---|---|---|---|---|
| 1 mm | A | Capacitor 1 | 1.05nF | 89 mohms | 382pH |
| | B | Capacitor 2 | 1.20nF | 86.5 mohms | 125pH |
| | C | Capacitor 3 | 1.7nF | 37.1 mohms | 74.6pH |
| 2 mm | A | Capacitor 4 | 6.49nF | 50.1 mohms | 308pH |
| | B | Capacitor 5 | 5.28nF | 128 mohms | 120.5pH |
| | C | Capacitor 6 | 6.6nF | 20.9 mohms | 65.17pH |
| 3 mm | A | Capacitor 9 | 15.3nF | 100 mohms | 218.2pH |
| | B | Capacitor 8 | 13.26nF | 15.4 mohms | 115pH |
| | C | Capacitor 7 | 13.2nF | 17.3 mohms | 79.39pH |

Capacitor-3

|  | Capacitance | Resistance | Inductance |
|---|---|---|---|
| Without Vias | 1.63nF | 34 mohms | 41.6pH |
| With Vias | 1.7nF | 37.1mohm | 74.6pH |

Capacitor-6

|  | Capacitance | Resistance | Inductance |
|---|---|---|---|
| Without Vias | 6.16nF | 10.7 mohms | 35.48pH |
| With Vias | 6.6nF | 20.9 mohms | 65.17pH |

Capacitor 7-3mm x 3mm

Capacitor spacing = 500um; Total capacitors used = 64

DEVICE HAVING AN ARRAY OF EMBEDDED CAPACITORS FOR POWER DELIVERY AND DECOUPLING OF HIGH SPEED INPUT/OUTPUT CIRCUITRY OF AN INTEGRATED CIRCUIT

FIELD OF THE INVENTION

The present invention relates to the design, layout and structure of an electronic integrated circuit (IC) package that demonstrates the ability to provide power supply and decoupling for high speed input/output (I/O) drivers through the use of an array of embedded capacitor layers.

TECHNICAL BACKGROUND

The present invention concerns the field of decoupling capacitors. Decoupling capacitors on IC packages are often essential to reduce voltage fluctuations, supply charge and maintain integrity of power distribution. Surface Mount Technology (SMT) decoupling capacitors fail to provide decoupling above several hundred megahertz due to their high lead inductance. On-chip capacitors are effective only at gigahertz frequencies due to their low capacitance.

One of the main bottlenecks of transmitting high speed signals through transmission lines is managing the return currents. Wherever there is a return path discontinuity, the noise on the power/ground system gets coupled to the transmission lines. Conversely, any signal current coupling to the power/ground system creates power supply fluctuations. Return path discontinuities could be a major source of noise, such as ground bounce affecting the functionality of the IC, and electromagnetic interference. Discontinuities mainly occur due to signal vias penetrating power/ground planes, transmission lines crossing split power planes, and switching I/O drivers. Decoupling capacitors are essential for power management and handling the return currents to reduce the coupling between the signal transmission and power distribution systems. They are only effective if they are placed close to the return path discontinuity. Therefore, Surface Mount Technology (SMT) decoupling capacitors on a package or board fail to provide decoupling for I/O drivers and receivers above several hundred megahertz due to their high lead inductance. The main focus of this invention is the use of embedded capacitors inside the package to provide I/O decoupling and power supply. The embedded capacitors are formed by using thin dielectrics with high dielectric constant within the layer stack-up of the package.

The bit rates of I/O lines are increasing to provide higher digital bandwidth for processors communicating with, for example, memory chips. As a result of this, decoupling I/O lines is becoming a severe problem.

The present invention provides a solution for charge supply (power delivery) and the decoupling of IC's at the package level. It overcomes the certain inductance problems of the board decoupling methodologies and saves real estate on the chip by reducing the size of the required on-chip capacitance, thereby improving the performance of digital and mixed-signal systems by reducing the power supply noise and providing sufficient current to meet semiconductor switching speed requirements, particularly high current Input/output (I/O) drivers, at a low cost. The present invention has provided capacitors and packages which can provide a low impedance power/ground system close to the I/O drivers up to very high frequencies.

SUMMARY OF THE INVENTION

One embodiment of the present invention provides a device for providing a low noise power supply package to an integrated circuit comprising a semiconductor die, input/output power supply terminals, and an array of embedded ceramic capacitors selected from discrete, planar and combinations thereof wherein said capacitors are placed in the locations selected from within the perimeter of the shadow of the semiconductor die, partially within the perimeter of the shadow of the semiconductor die, near the perimeter of the shadow of the semiconductor die, and combinations thereof. A further embodiment provides a device for providing a low noise power supply package to an IC comprising using an array of embedded ceramic capacitors with different resonance frequencies, arranged in such a way that the capacitor array's impedance vs frequency curve yields low impedance values in the current supply and current return path.

Still a further embodiment provides a method for designing optimized capacitor arrays comprising the following steps: a) building integrated circuit package test structures wherein said structures comprise input/output supply terminals, and an array of embedded ceramic capacitors selected from discrete, planar and combinations thereof wherein said capacitors are placed in the locations selected from within the perimeter of shadow of the die, partially within the perimeter of the shadow of the die, near the die, and combinations thereof, and wherein said structures include different capacitor designs, sizes, via interconnects and interconnections; b) measuring their individual capacitance, resistance, and inductance values and impedance versus frequency responses; and c) modeling composite impedance versus frequency response for a variety of capacitor arrays to meet a impedance target, and d) fabricating and testing a structure based on the modeling results.

The present invention also provides for an optimized capacitor array formed by the method above and a device comprising the optimized capacitor array.

BRIEF DESCRIPTION OF THE FIGURES

FIG. 4 describes a capacitor Type A.

FIG. 15(*a*) shows a planar capacitor and a discrete capacitor included in:

a layer stack-up of a package with an embedded capacitor array.

FIG. 15 (b) shows the layout of an embedded capacitor array.

Figure 16:
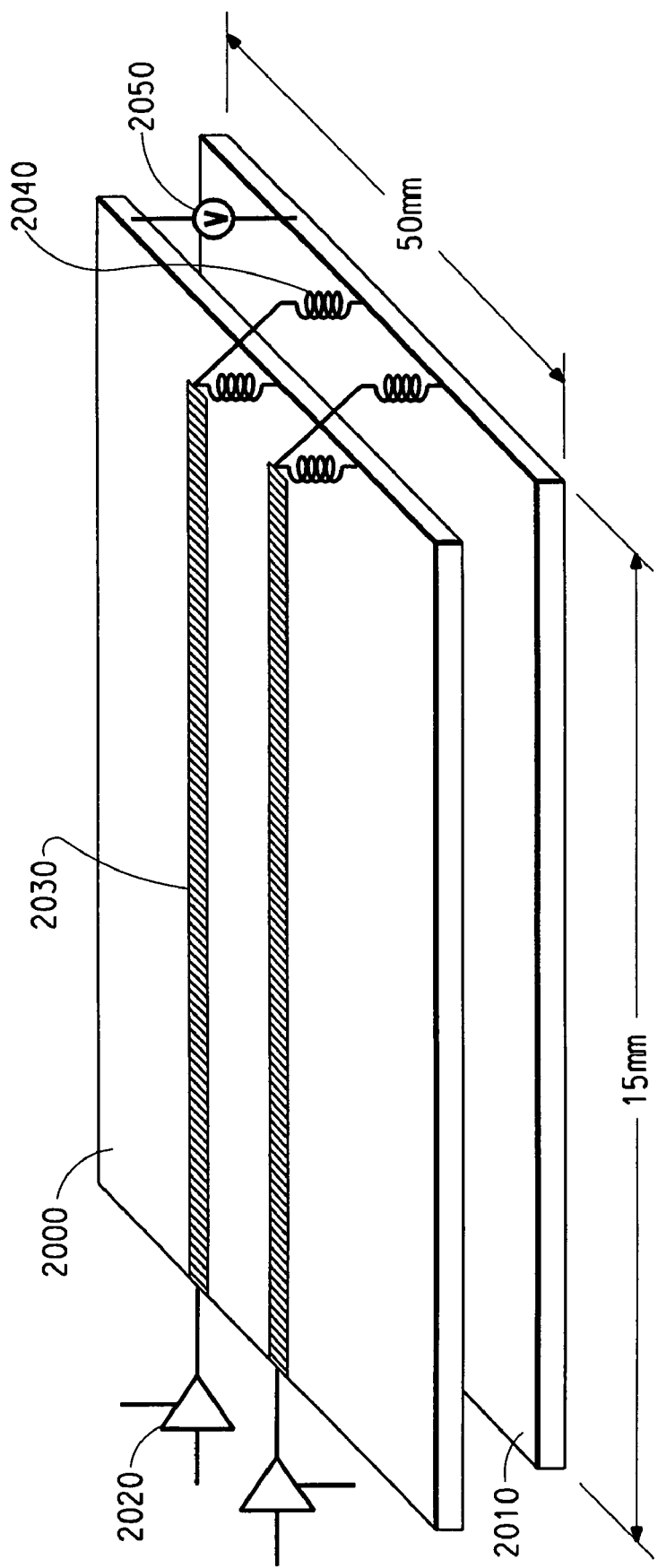

FIG. 16 depicts a simulation model for uncoupled transmission lines.

FIG. 17 shows the uncoupled line eye diagram comparisons for two power plane substrate dielectric constants.

Figure 18A:
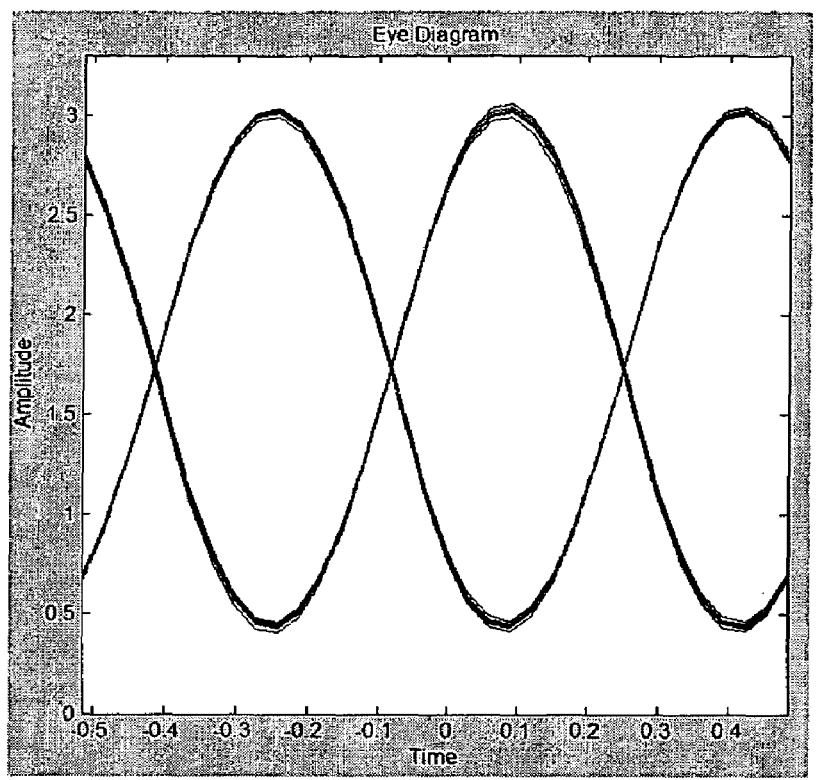
Figure 18B:
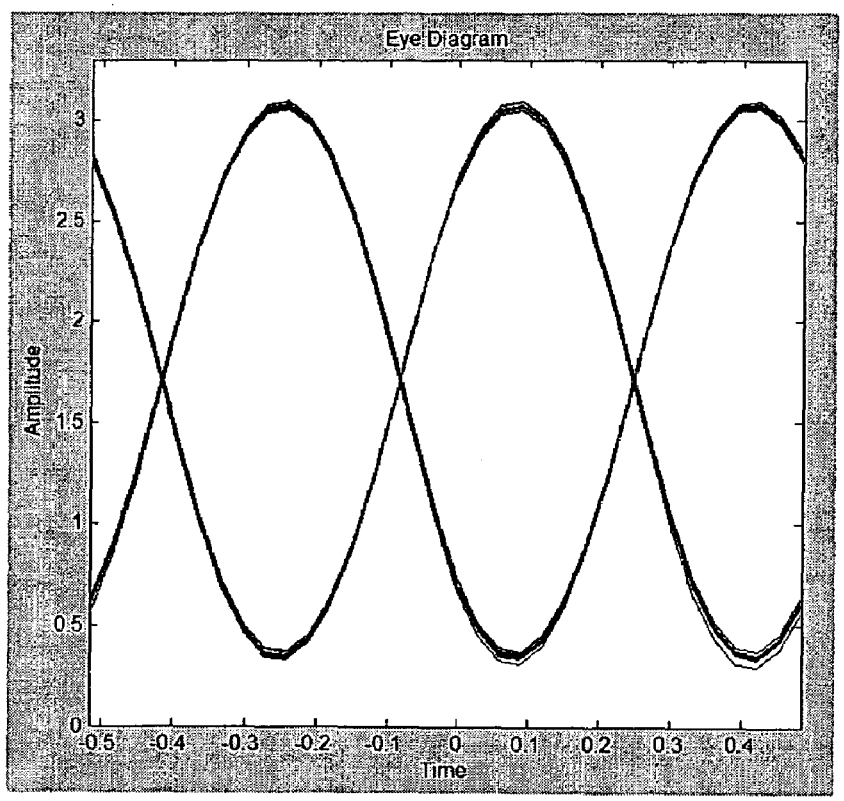

FIGS. 18A and 18B show the coupled line eye diagram comparisons for two power plane substrate dielectric constants.

Figure 19:
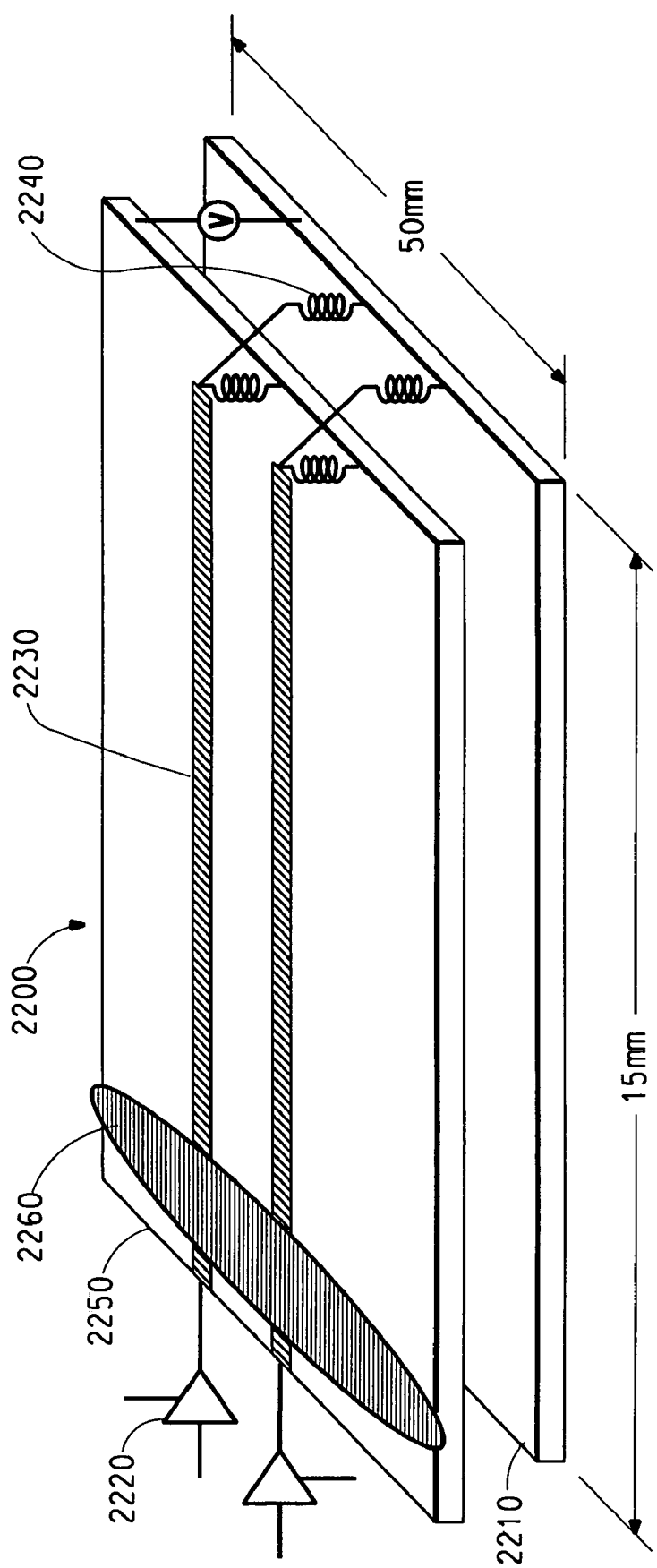

FIG. 19 depicts the simulation model for coupled transmission lines showing the locations of the decoupling capacitors and the location of the simultaneous switching noise (SSN) response.

Figure 20:
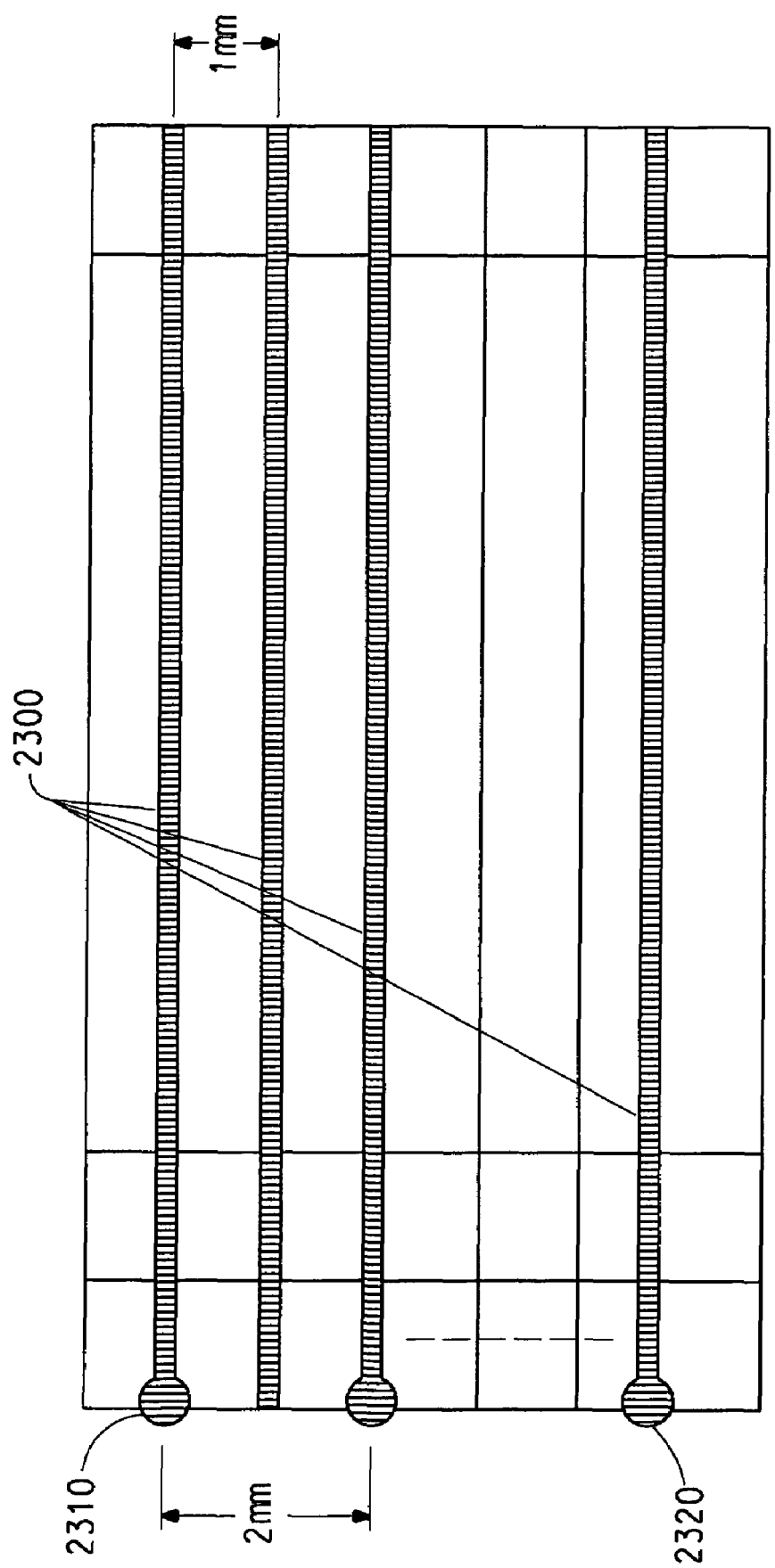

FIG. 20 shows the locations of the discrete I/O decoupling capacitors, I/O drivers and transmission lines in the simulation model.

Figure 21A:
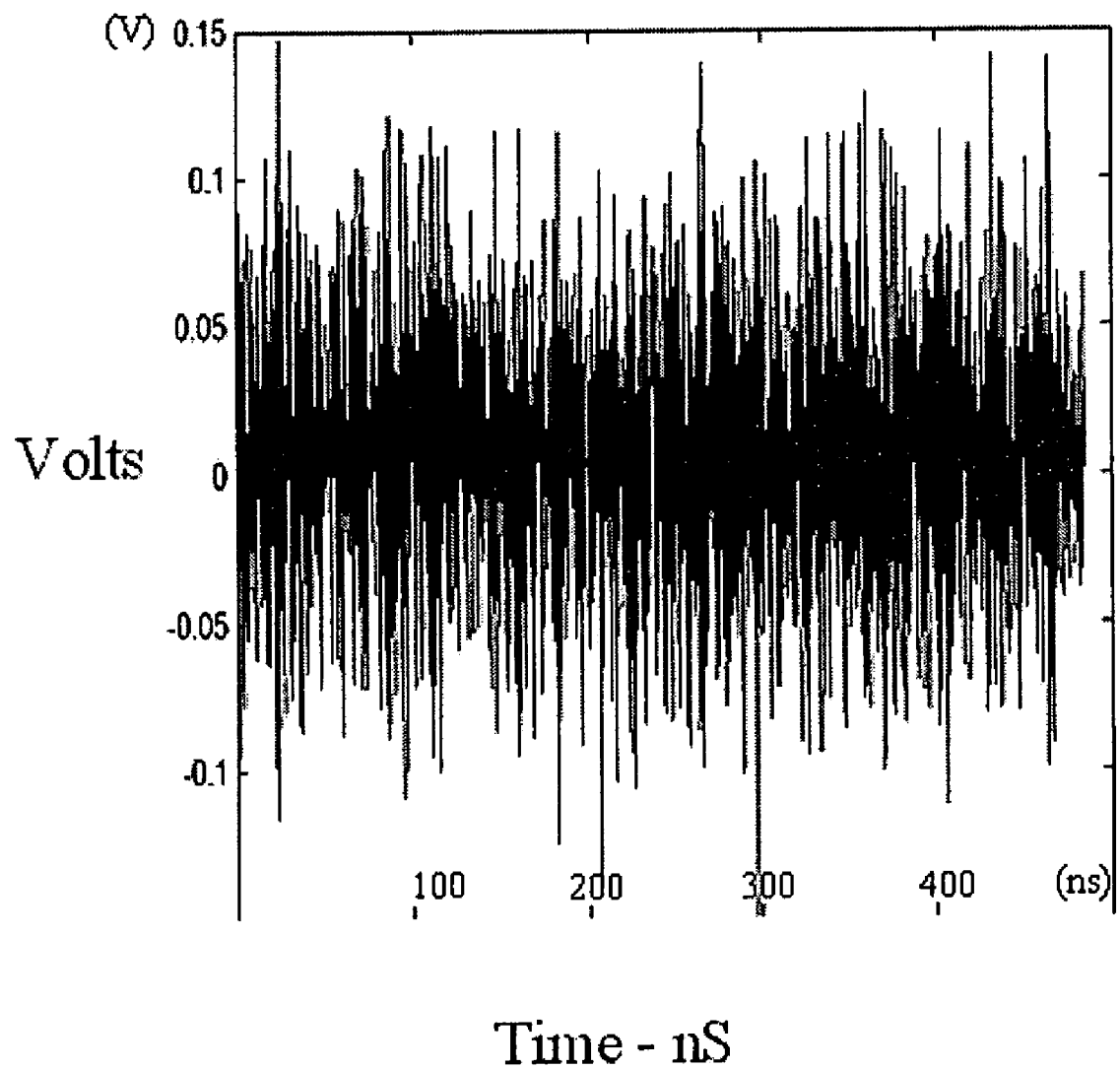
Figure 21B:
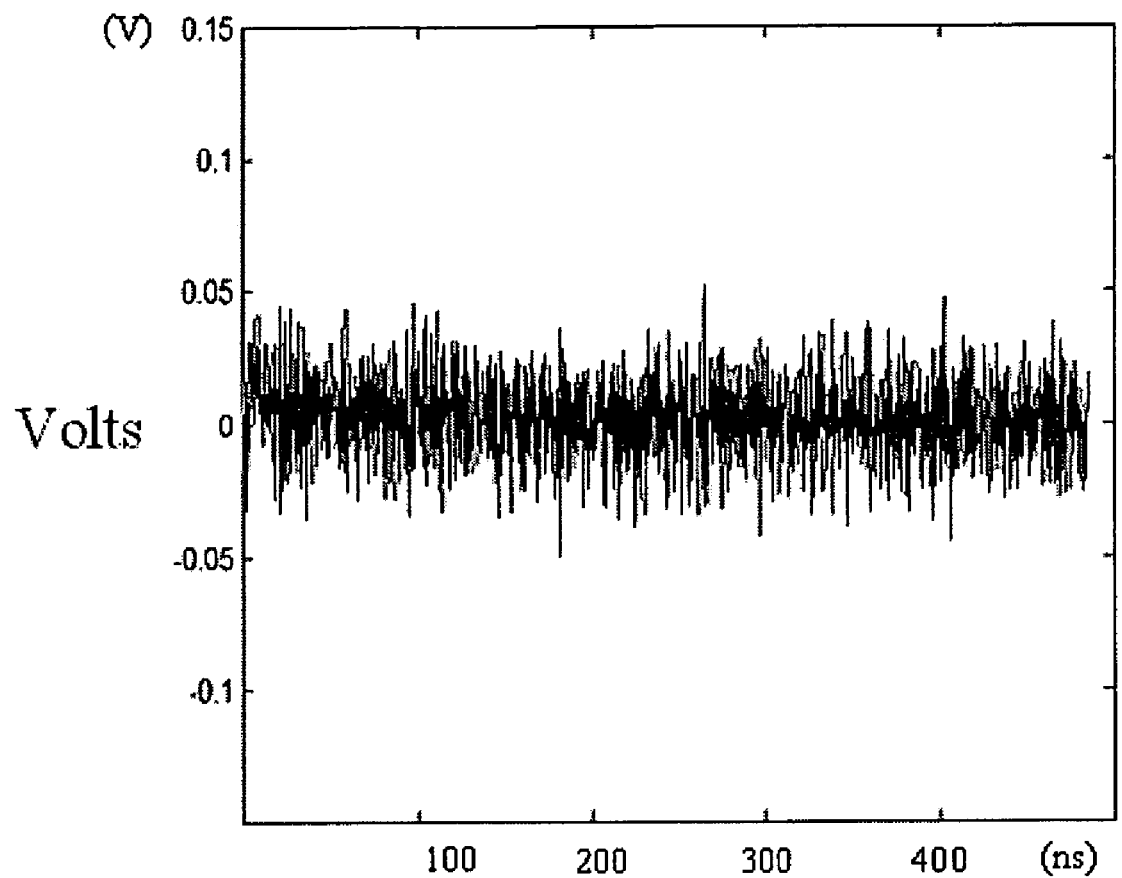

FIGS. 21A and 21B show the simultaneous switching noise (SSN) response for surface mount technology (SMT) discrete and embedded discrete capacitors for 2 planar power plane substrate dielectric constants.

Figure 22:
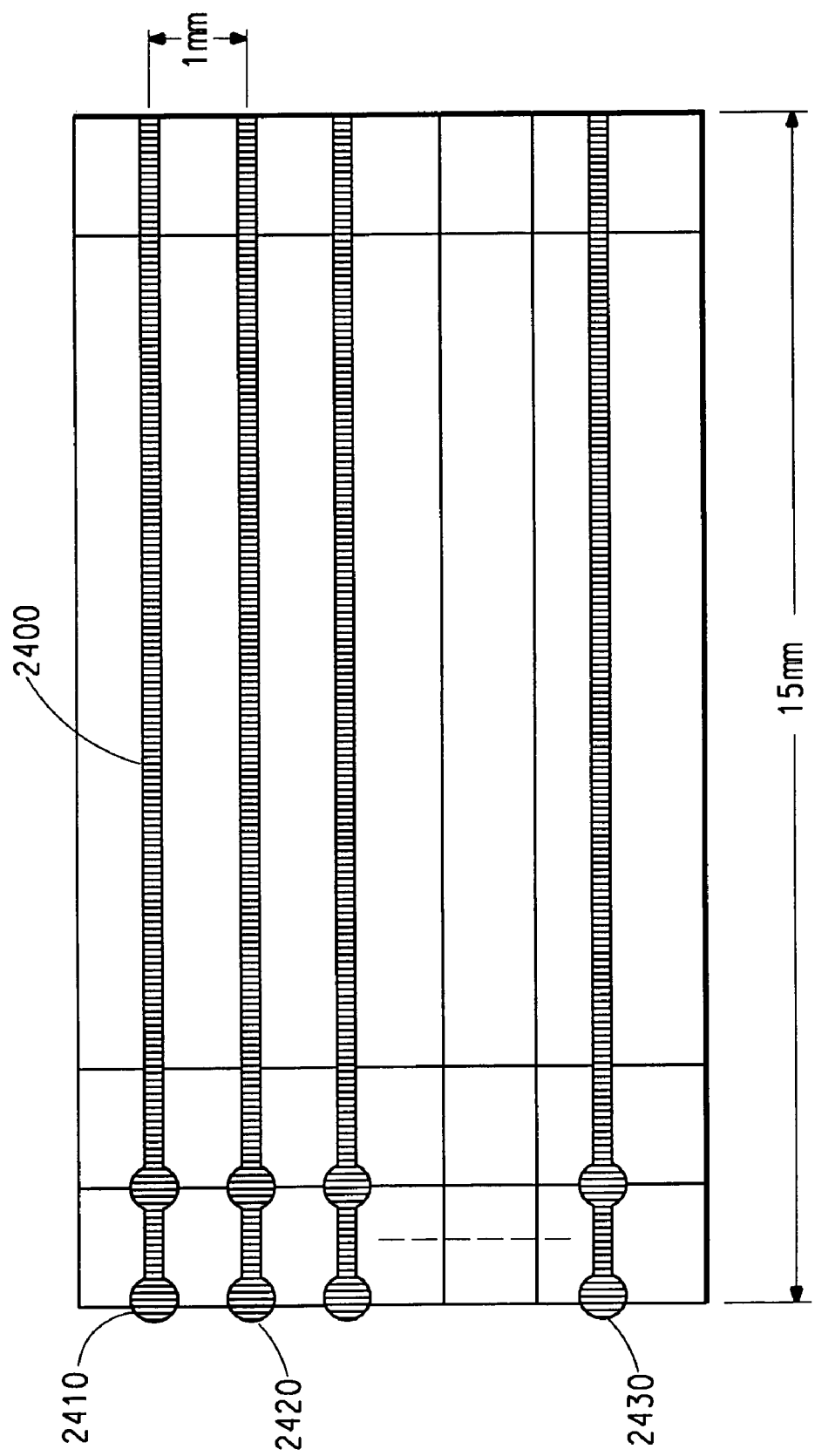

FIG. 22 illustrates the locations of 50 decoupling capacitors with respect to the signal transmission lines in the simulation model.

Figure 23A:
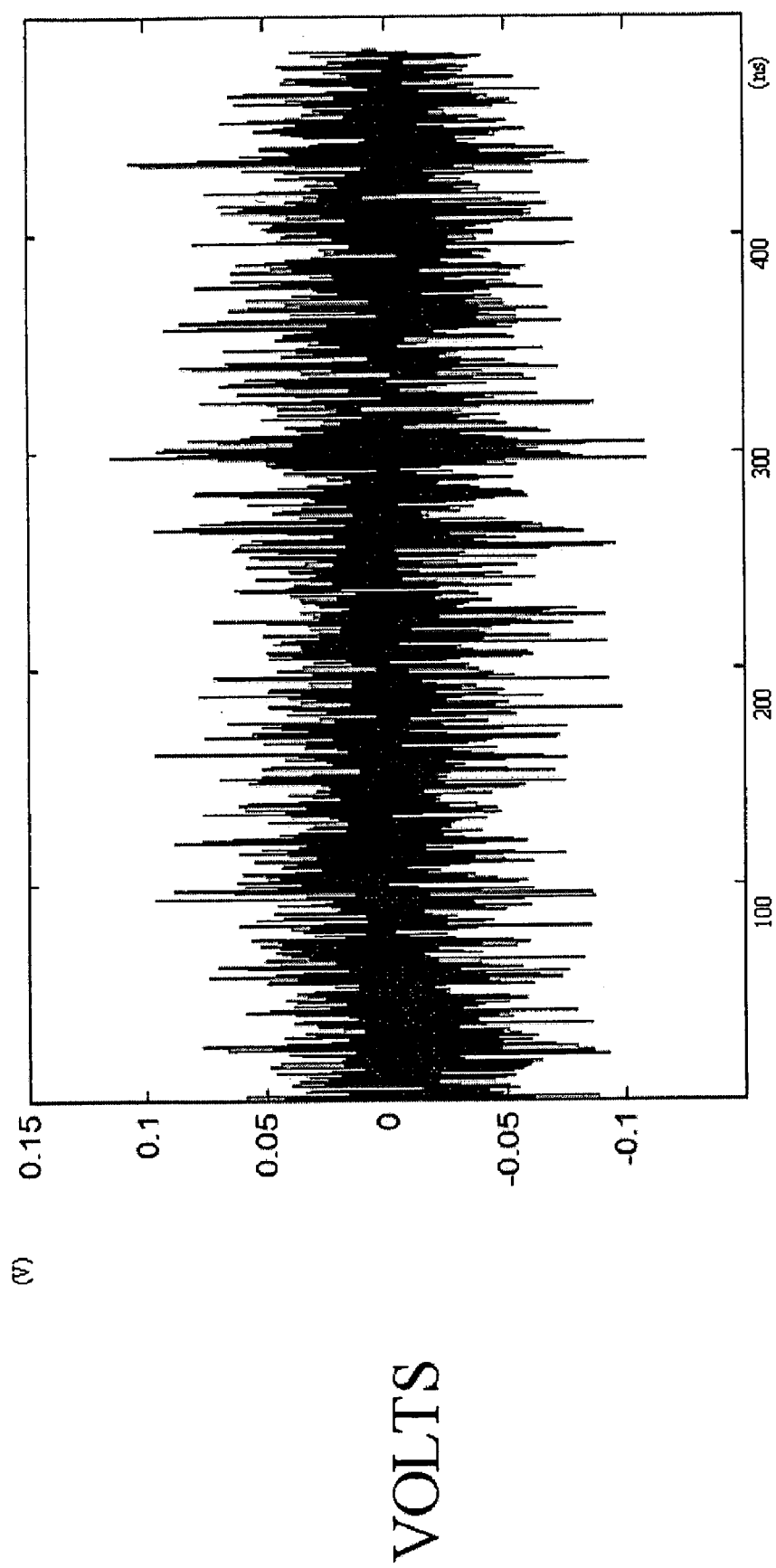
Figure 23B:
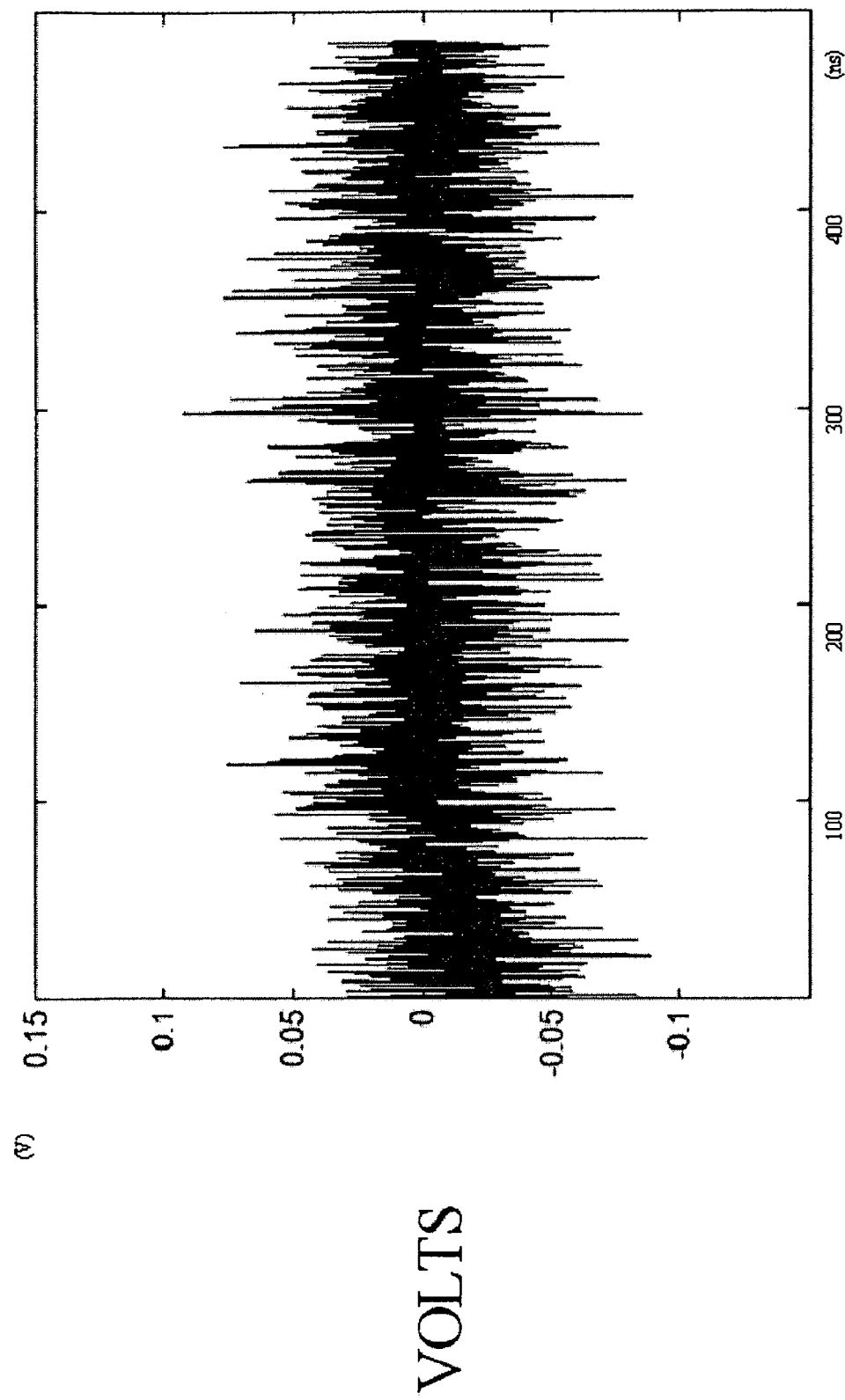
Figure 23C:
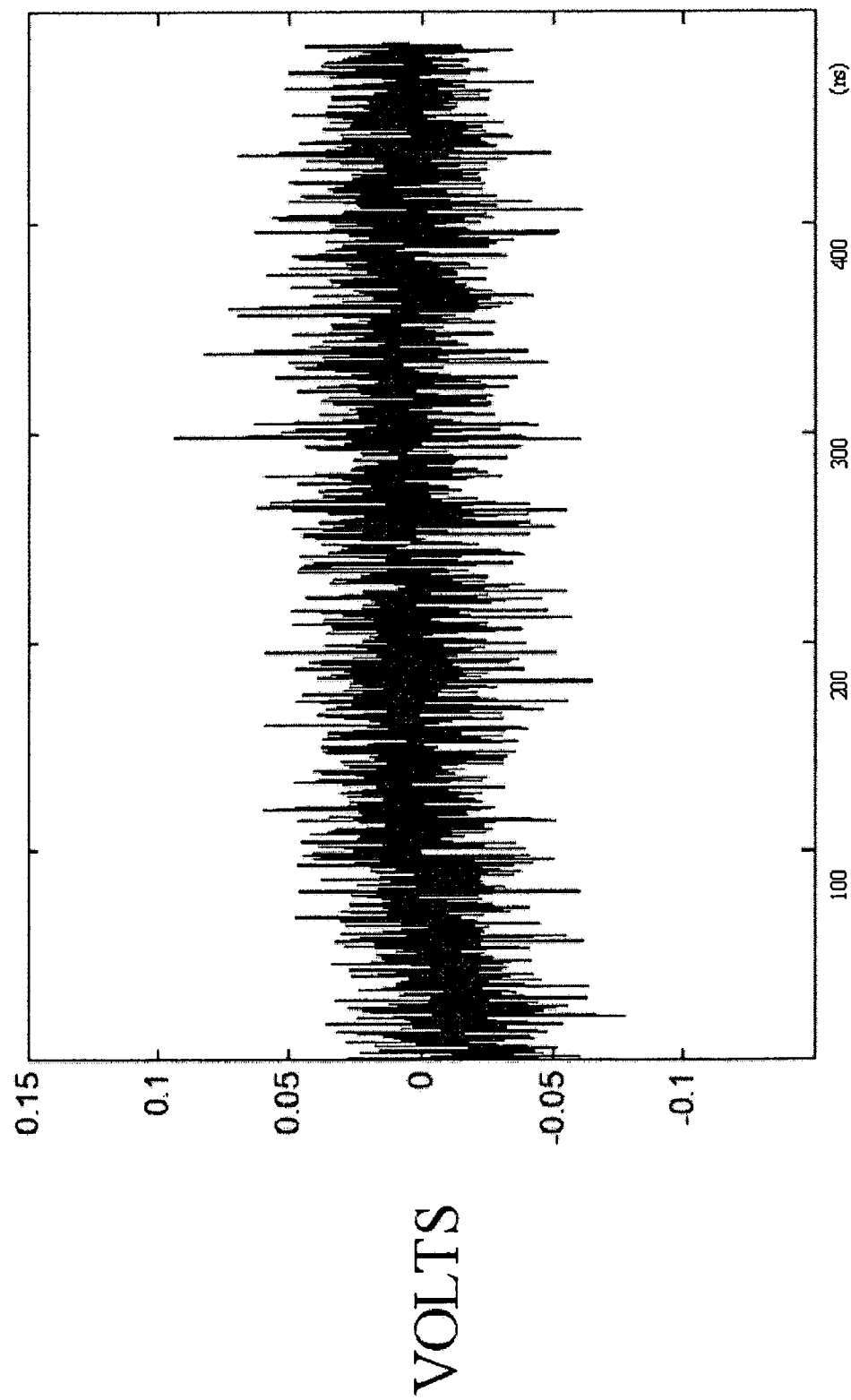

FIGS. 23A, 23B, and 23C show the SSN response in a number of SMT discrete capacitors and a planar substrate with dielectric constant of 3.8.

Figure 24:
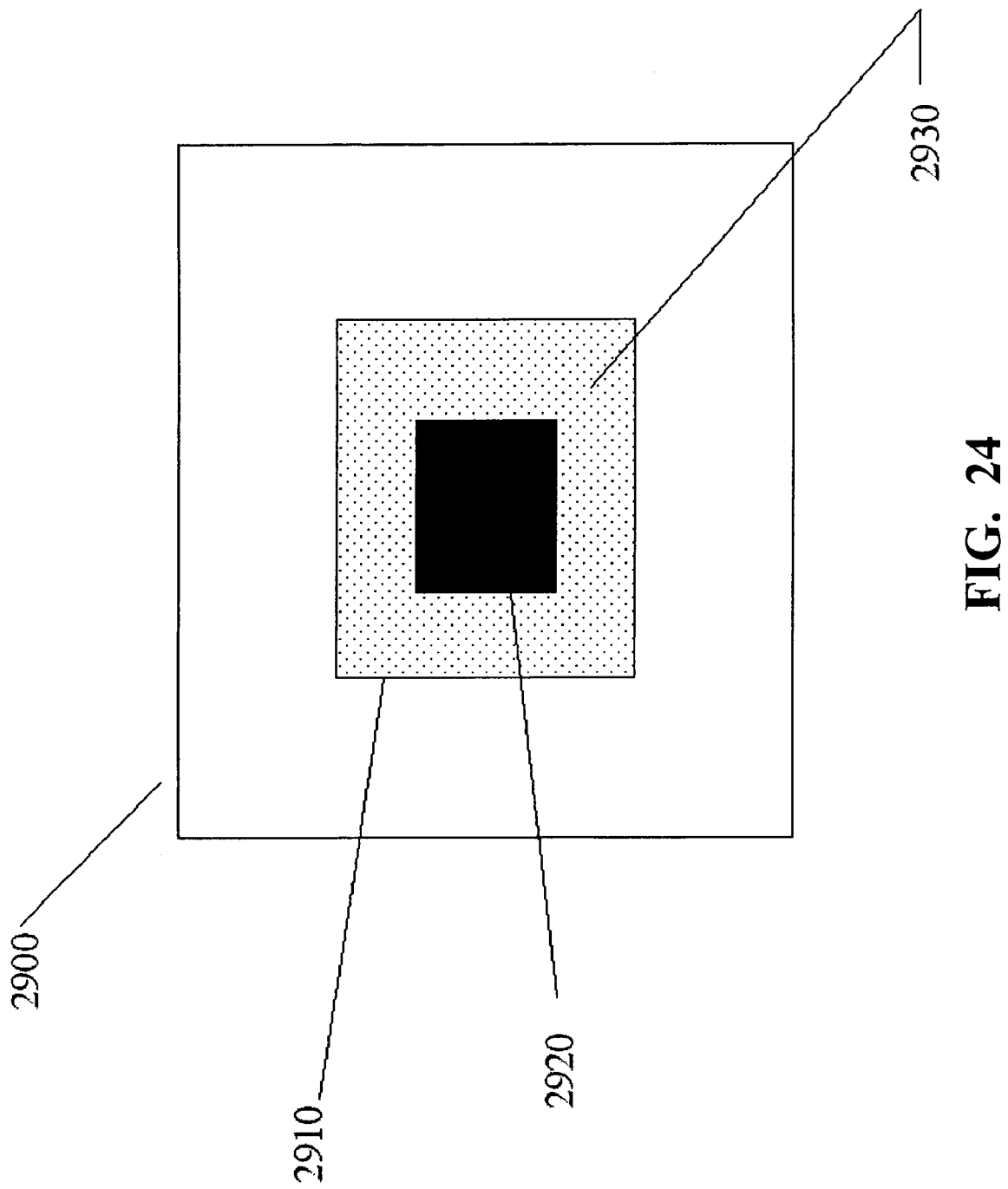

FIG. 24 details a plan view of a package including die, I/O, and core logic areas.

Figure 25:
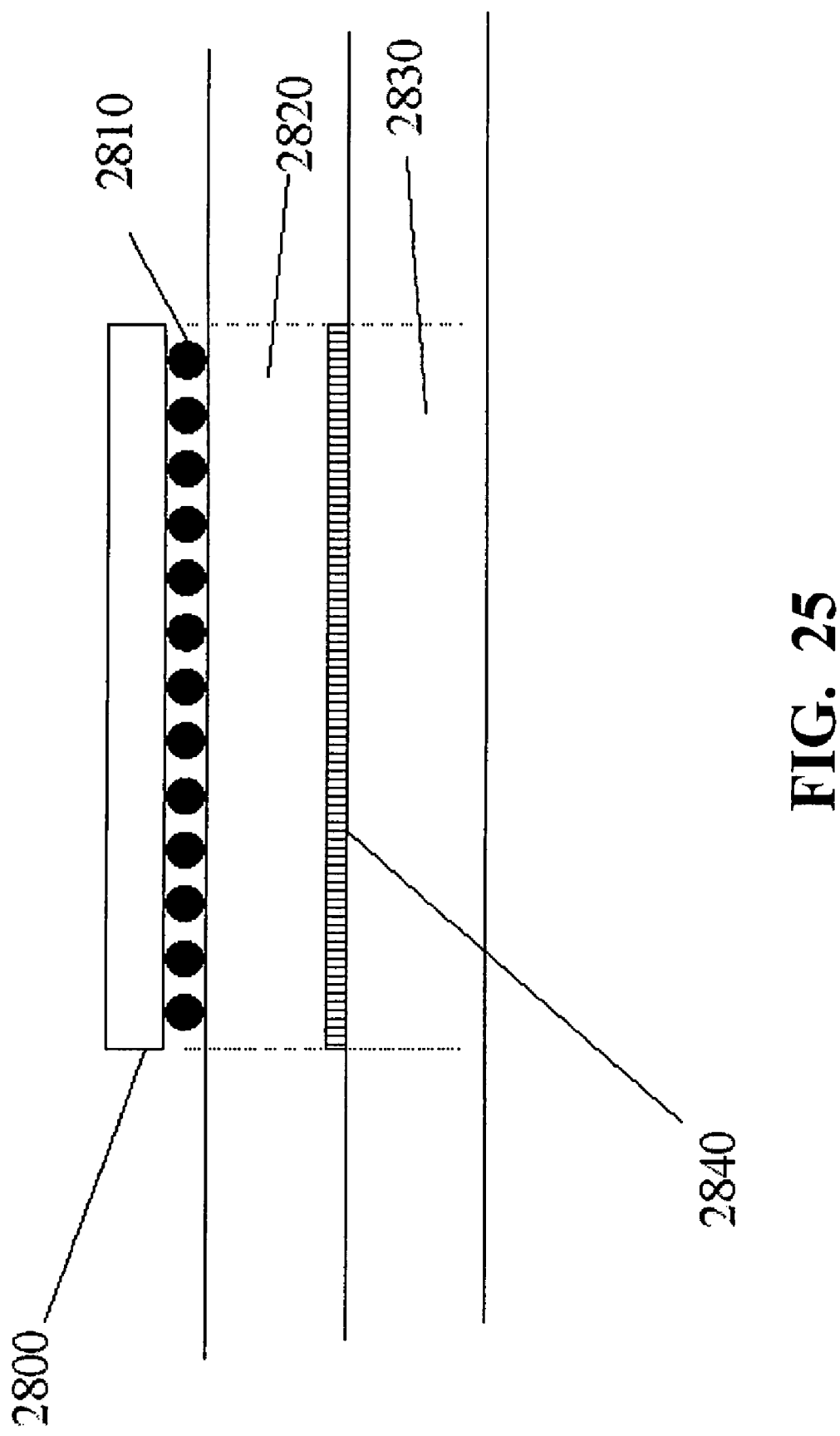

FIG. 25 represents a cross section view of a die on a package, indicating the "die shadow".

DETAILED DESCRIPTION OF THE INVENTION

The focus of this invention is on the use of embedded capacitor arrays in the structure of an electronic IC package to provide sufficient charge supply and a clean power delivery package to high speed input/output drivers. The embedded capacitor arrays are formed by using thin dielectrics with high dielectric constant within the layer stack-up of the package.

To overcome the problems noted above with I/O decoupling, decoupling capacitors have to be placed as close as possible to the I/O drivers. This ensures that the loop inductance formed by the signal current and its return current is low, so that there is less noise injected into the power/ground system. SMT capacitors on the board are ineffective at high frequencies due to their high lead inductance. On-chip capacitance that can be added is limited to the real estate on-chip. An increase in the amount of on-chip decoupling capacitance will increase the cost and the size of the chip. Embedded capacitors on the package, therefore, provide an optimum way of decoupling for I/O drivers.

In addition to the switching behavior of I/O drivers, signal vias also cause return path discontiuinties. The return currents on the reference planes of two transmission lines connected with a via have to be continous. Otherwise, the current return path discontinuity causes power/ground noise. Especially simultaneously switching drivers can cause significant amount of noise, which is designated as simultaneous switching noise (SSN). In one embodiment of the present invention, embedded capacitors are be placed as close as possible to the via hole, so they provide the best way of managing the return currents.

The embedded capacitors inside the package for I/O decoupling can either be a planar capacitor at least as large as the package or it can consist of parallel connected smaller size capacitors. Both capacitor types help to improve the signal integrity.

This invention provides a solution for the decoupling of high speed I/Os at the package level. It overcomes the inductance problem of the board decoupling methodologies for high speed signals by providing a low impedance current return path.

One embodiment of the present invention provides a device for providing a low noise power supply package to an IC comprising installing in said package an array of embedded ceramic capacitors.

A further embodiment of the invention uses embedded capacitor arrays so as to provide a clean power delivery package. In one embodiment, the embedded capacitor arrays are formed by using thin dielectrics with high dielectric constant within the layer stack-up of the package. In a further embodiment, the embedded capacitor arrays are formed by technology selected from thick film, thin film and combinations thereof. The array of embedded capacitors may be connected in parallel or connected individually in other locations and may be made up of capacitors that have different resonance frequencies and be of different sizes and shapes.

Figure 1:
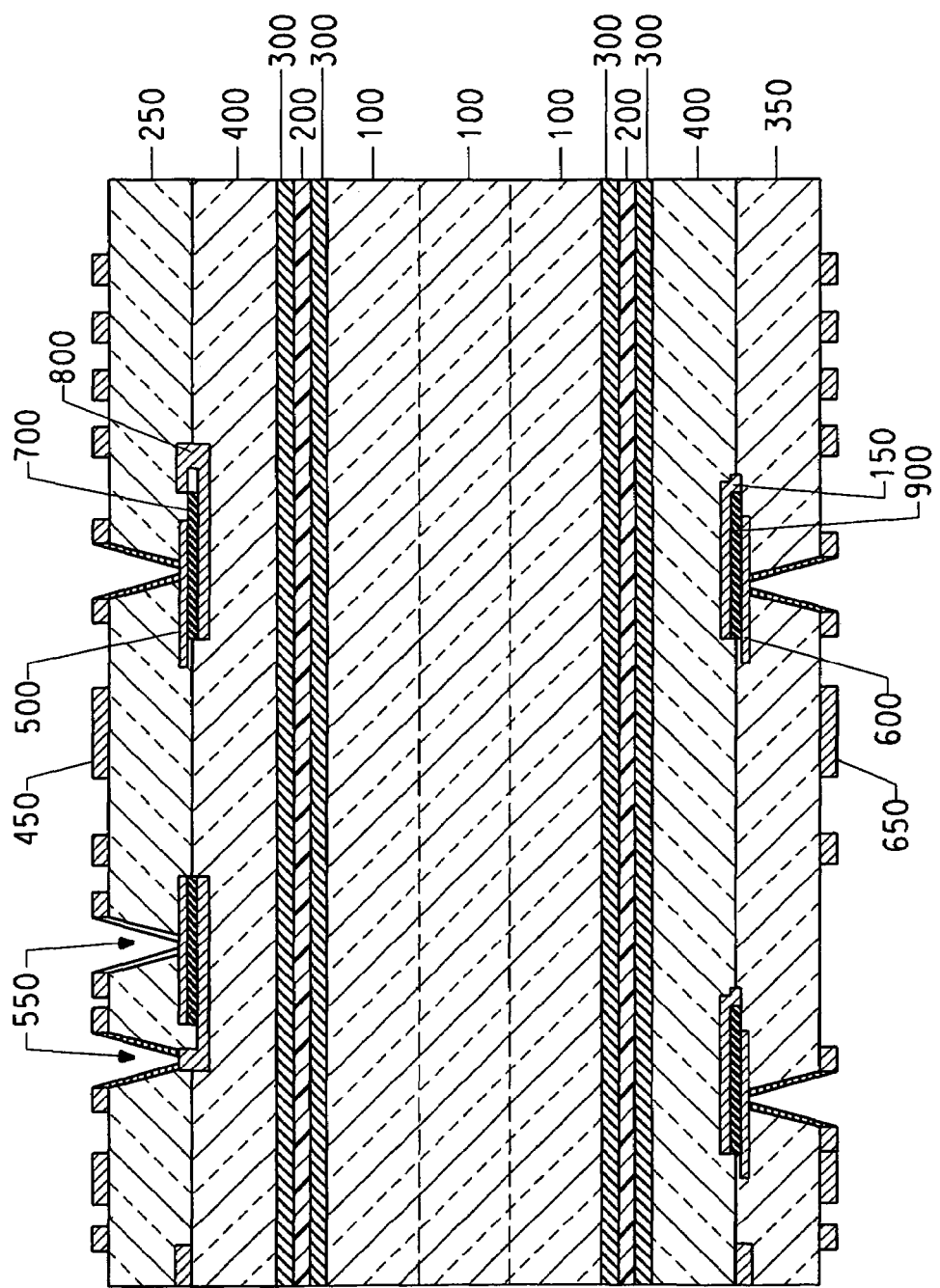
FIG. 1 describes a stackup of a test structure.
Figure 2:
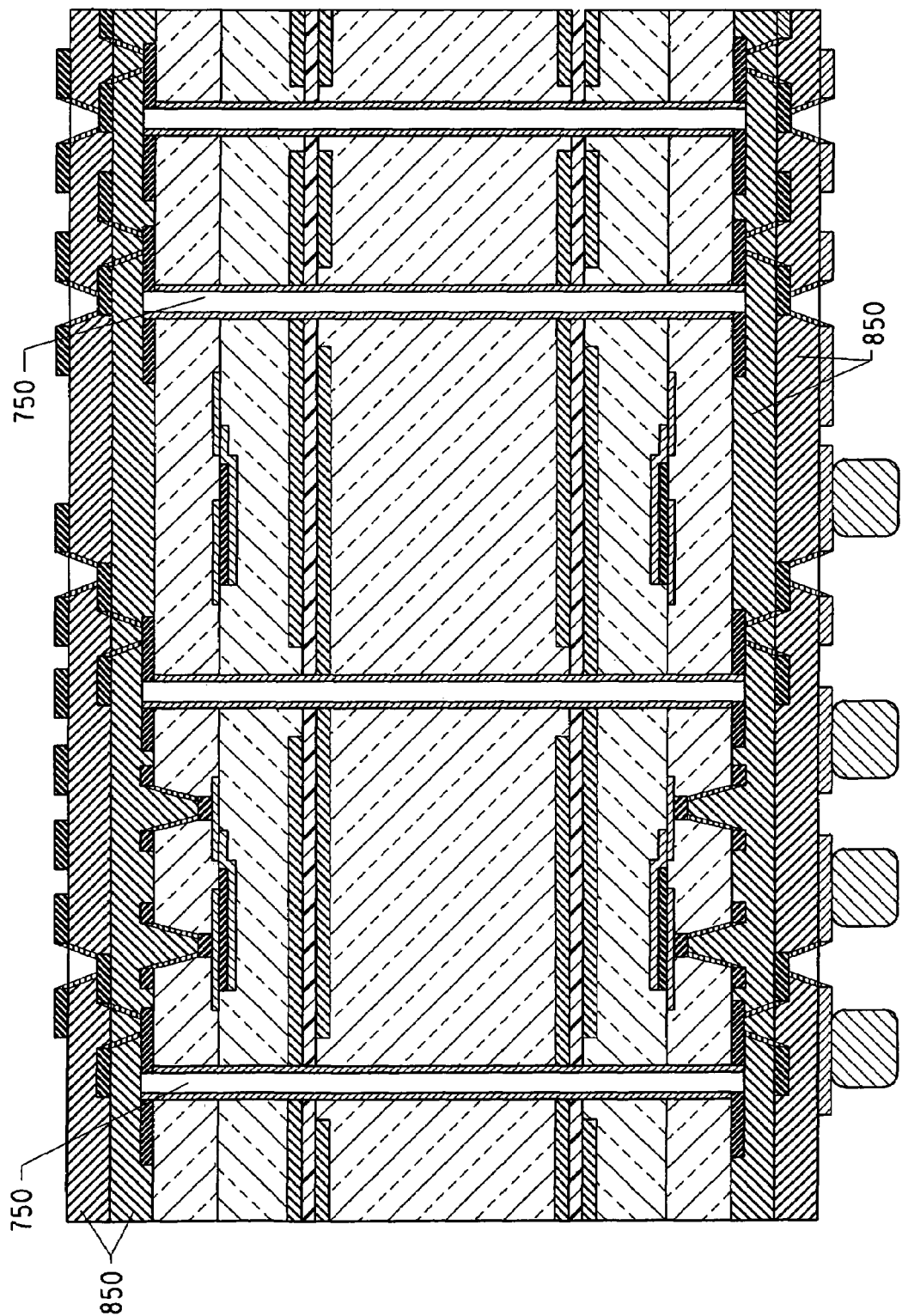
FIG. 2 describes a test vehicle stack-up structure.

FIG. 1 shows a package cross-section with embedded capacitor layers. The capacitor array can be formed with discrete, planar, or combinations of discrete and planar capacitors. FIG. 2 shows an embedded capacitor array layout in the package. Different sized capacitors constitute this array. An array is defined as a grouping or arrangement of elements, herein. In the present invention, the elements of the array are capacitors, both discrete and planar.

The rationale for using various sized capacitors is that the capacitance, equivilant series resistance (ESR) and equivilant series inductance (ESL) associated with each of them is different, which translates into a different resonant frequency. For optimal performance, the capacitors should be placed as close as possible to the input/output supply. The vias that connect the capacitors to the power/ground solder balls of a chip also influence the performance of the array. By proper co-design of the vias and capacitors, a desired impedance and frequency range can be targeted. In one embodiment, the capacitors are connected in parallel with each other to meet the low target impedance requirement of the input impedance of the power delivery network at the chip level. The number of capacitors required for a particular type of use can be determined from the series resistance of an individual capacitor. The parallel combination of the series resistances should be below the target impedance requirement. The capacitor frequency response is very sensitive to its position in the package.

The discrete capacitors typically range in size from 0.25 to 5 millimeters. In one embodiment, the range is 0.5 to 3 millimeters. However, it is understood by those skilled in the art that any conceivable discrete or planar capacitor size ranges are possible.

The embedded capacitors of the array may be placed in locations selected from within the perimeter of the shadow of the semiconductor die, partially within the perimeter of the shadow of the semiconductor die, near the perimeter of the shadow of the semiconductor die, and combinations thereof. The array of embedded ceramic capacitors may be selected from discrete capacitors, planar capacitors and combinations thereof. In one embodiment, it is important to be able to place these low ESL capacitors in the I/O area of the "die shadow" of the processor. In general, the I/O area of the die shadow is at or near the perimeter of the die. In one embodiment, the capacitors are as close as possible to the input/output supply terminals. In one embodiment, placement of these capacitors outside the die shadow is not preferred because it may cause routing problems and change the predicted performance of a capacitor because of the increased inductance and resistance. However, in a further embodiment, the capacitors may be placed outside of the die shadow near the perimeter of the die shadow.

"Die shadow" is defined herein as area of the package projected under the footprint of the die, as viewed from the top. Typically, there are layers between the capacitor array and the die. In some embodiments, the array of capacitors may lie partially outside of the "die shadow" and still supply adequate power supply and decoupling. There is an increase in the power consumption of microprocessors for future technology nodes, accompanied by a decrease in the supply voltage. This results in tighter noise margins for the supply voltage fluctuations. The power delivery network provides the power supply to the IC. If improperly designed, this network could be a major source of noise, such as ground bounce affecting the functionality of the IC, and producing electromagnetic interference. In order to reduce the supply voltage fluctuations, the magnitude of the input impedance of the power delivery network close to the chip has to be kept at a very small value. This low impedance has to be maintained from dc to multiples of the clock frequency and I/O data rate. Decoupling capacitors play a very important role in the power delivery network as they also act as charge providers for the I/O switching circuits. They should provide low impedance, dictating a high capacitance, low parasitic inductance, and low parasitic resistance. Whatever technology is used on the board (such as SMT capacitors or buried capacitors on the board), the inductance of the package power supply leads can result in ineffective decoupling. This cannot be addressed by using on-chip capacitors either, since the amount of on-chip capacitance that can be added is limited to the real estate on-chip. This serves as a limitation for on-chip capacitors to decouple high speed I/O drivers. An increase in the amount of on-chip decoupling capacitance will increase the cost and the size of the chip. Embedded capacitor arrays inside the package can provide sufficient decoupling, due to their low parasitic inductance and resistance and high capacitance. The lower inductance compared with SMT capacitors on the board is due to their closer position to the die or chip.

The devices (or packages) of the present invention may be selected from, but are not limited to, an interposer, printed wiring board, multichip module, area array package, system-on-package, system-in-package, and the like.

EXAMPLES

Fabrication of a structure containing embedded ceramic capacitors (see FIG. 1).

Three 100 micron thick layers of BT (bismaleimide triazine) prepreg (B-stage resin on glass weave; type GHPL 830HS) from Mitsubishi Gas Chemical [100] were laminated to two planar capacitance laminates (DuPont Interra® HK11, commercially available from E.I. du Pont de Nemours and Company). The HK11 consisted of 14 μm thick, filled polyimide [200] with 35 μm copper foil on each side [300]. (Note: this test structure was a precursor to a more complex test vehicle (FIG. 2) in which the planar capacitor layers are connected to PTHs (plated throughholes) [750] and additional microvia build-up layers [850]—metal layers M1, M2, M13, and M14, not shown in FIG. 1—are added to the test structure). Discrete ceramic capacitors were formed on two copper foils (metal layers M4 [500] and M10 [600]) as described in U.S. Pat. No. 6,317,023. The foils were 35 μm thick copper, the dielectric composition [700, 900] was DuPont's EP310, commercially available from E.I. du Pont de Nemours and Company (20 μm fired thickness), and the screen printed copper electrode was 5 μm fired thickness copper (metal layers M5 [800]and M11 [150], DuPont's EP320, commercially available from E.I. du Pont de Nemours and Company). The metal foils M4 and M10 were then layed up with 100 μm BT prepreg [400] on either side of the structure containing the two planar capacitor layers and laminated. A multilayer bonding coating was then applied to metal layers M4 and M10. Metal layers M4 and M10 were then structured in a (subtractive) print & etch photo-lithographic process. BT prepreg (100 μm) [250, 350], capped with 3 μm copper foil [450, 650] was then laminated to the structure on both sides (metal layers M3 and M12). Blind vias (microvias, 150 μm diameter) [550] were then drilled with a UV-laser through M3 and M12 and the underlying prepreg layers to connect to metal layers M4 and M10. The microvia holewalls were then prepared by standard swell and (permanganate) etch chemistry, followed by electroless copper deposition. The patterning of metal Layers M3 and M12 and copper build-up in the microvias was accomplished by a semi-additive plating process (apply plating resist pattern, plate 12 μm copper, strip resist, differential etch of base copper).

Figure 3:
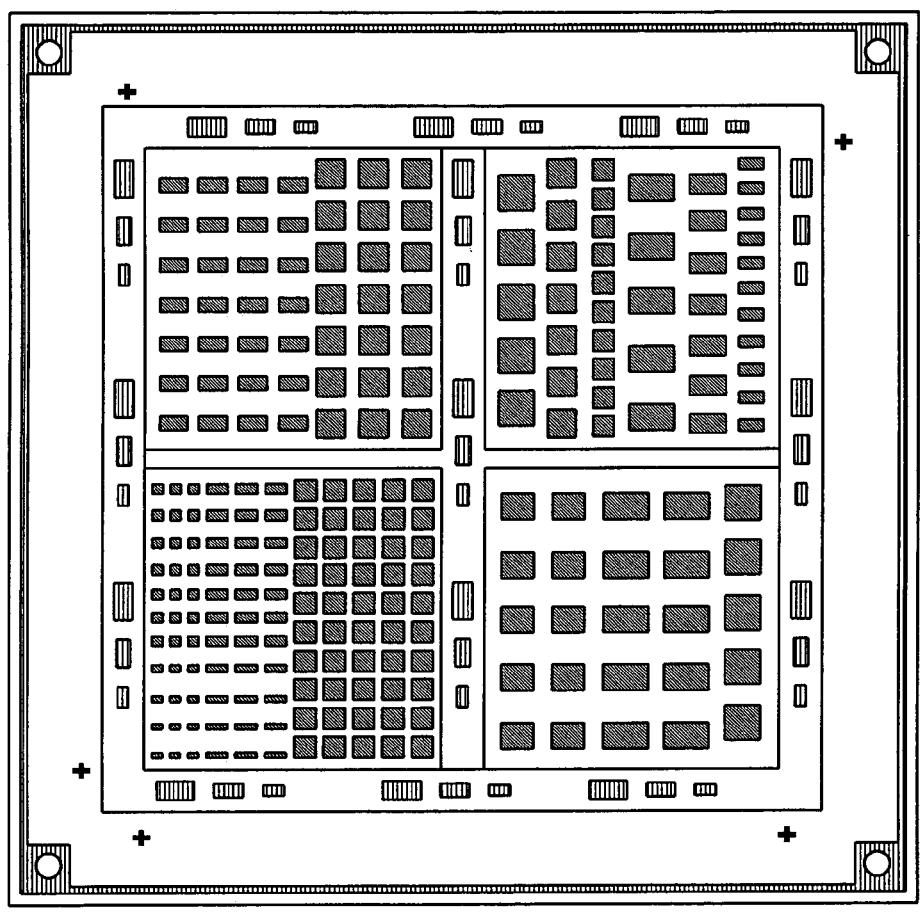
FIG. 3 describes a pattern of capacitors on metal layers [150] and [800].
Figures 5A, 5B, 5C:
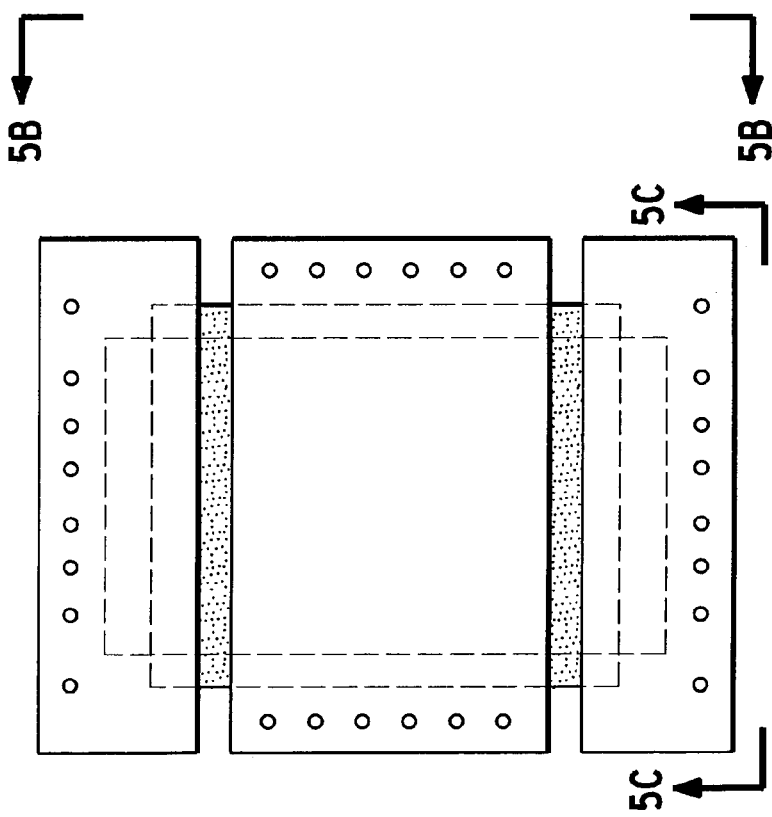
FIG. 5 describes a capacitor Type B.
Figure 6B:
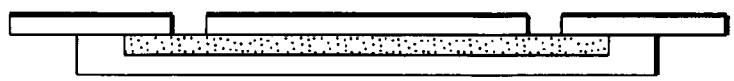
FIG. 6 describes a capacitor Type C.
Figure 6A:
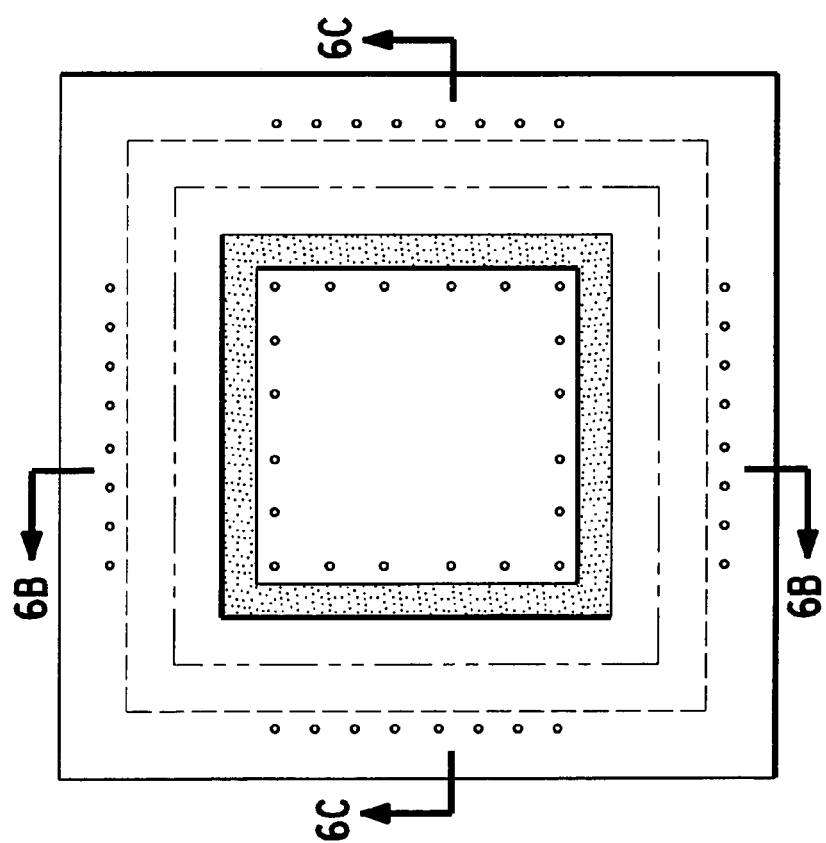
Figure 6C:
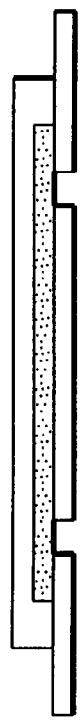

The layout of the embedded capacitors on metal layers M5 and M11 is shown in FIG. 3. There are three different capacitor designs: Type A (FIG. 4), Type B (FIG. 5), and Type C (FIG. 6). For each type, there are capacitors with 1 mm$^2$, 4 mm$^2$, and 9 mm$^2$ effective capacitor size (area). The capacitor designs differ in the relative position and size of the foil electrodes [1200], the dielectric [1400], and the screen printed copper electrode [1300]. They further differ in the design of the clearance (gap) that insulates the two copper electrodes, and they differ in location and number of vias [1100] that connect the embedded capacitor to the next metal layer above. For the 9 mm$^2$ size capacitor, Type A design features 4 via connections, Type B has 28 vias, and Type C has 52 vias.

The electrical parameters (capacitance, resistance, inductance) of individual capacitors, with and without via connections, were measured. The impedance vs frequency response for individual capacitors was measured. The measured response curves were compared with the curves generated by the simulation model. The model was then used to simulate the impedance of several capacitor arrays, applying conservative as well as advanced design rules for the embedded capacitor arrays.

Figure 7:
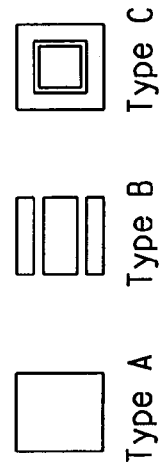
FIG. 7 is a chart showing capacitor parameters without vias.
Figure 8:
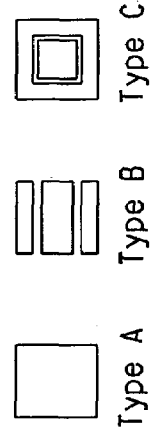
FIG. 8 is a chart showing capacitor parameters with vias.

Results:

FIG. 7 summarizes the capacitance, resistance, and inductance measurements for Type A, B, and C type capacitors of 1, 4, and 9 mm$^2$ size, without via connections. It shows that the capacitance goes up with size, as expected, and does not vary much with the design type. Inductance values of all three types, without via connections, are fairly similar. FIG. 8 shows the same parameters for capacitors of Type A, B, and C with via connections. The data show that capacitor type and the number of vias and their location greatly affects the resistance and inductance of the capacitor.

Figure 9A:
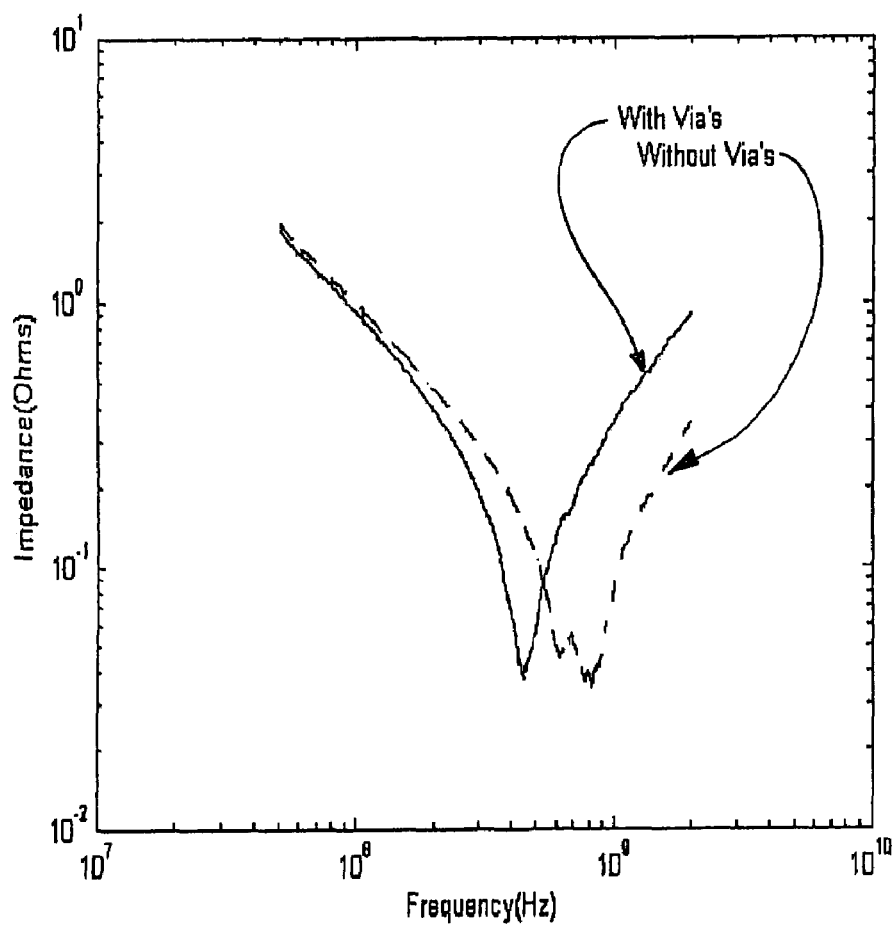
FIGS. 9 (*a*) and (*b*) graphs measurement results with and without vias.
Figure 9B:
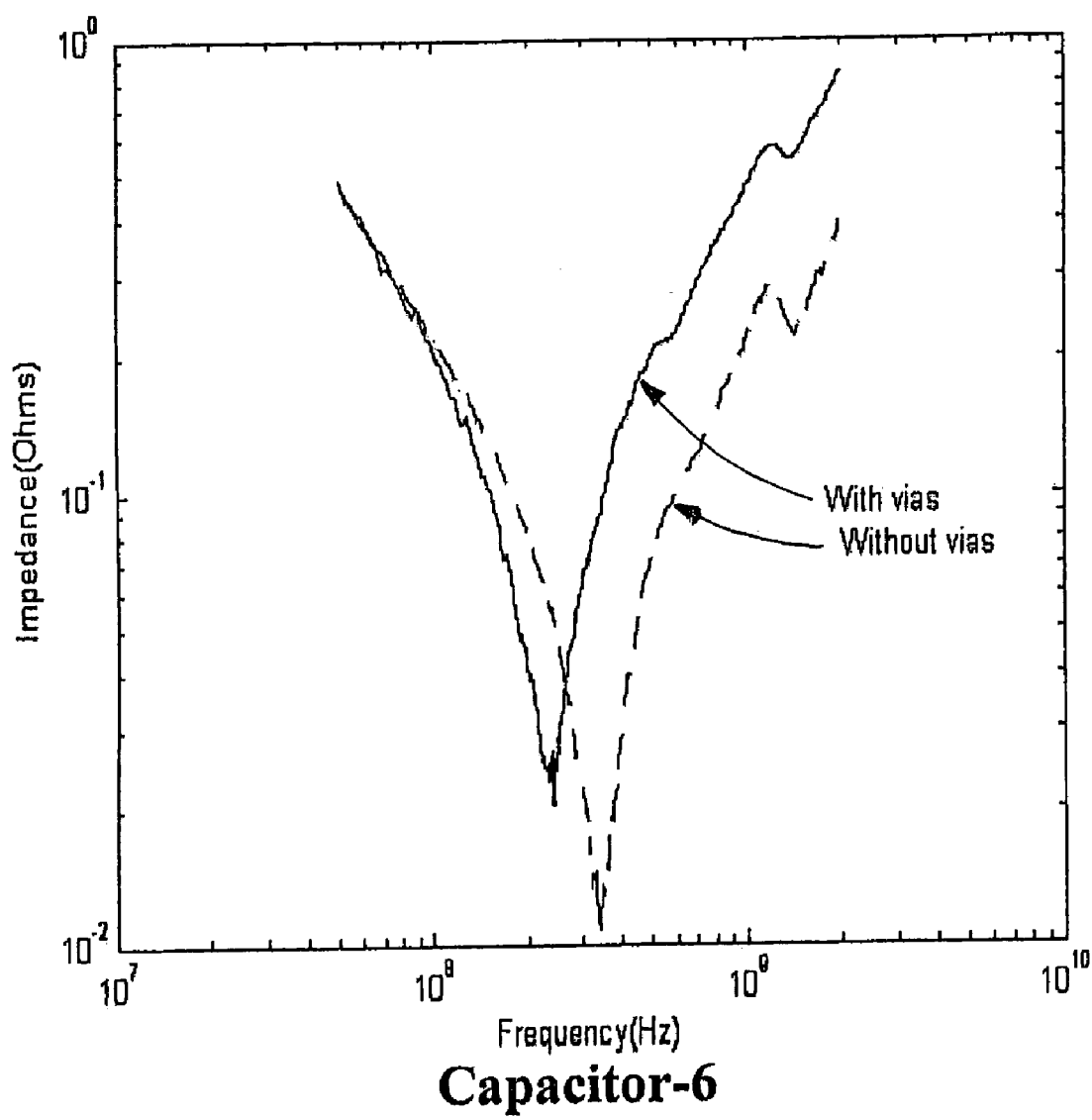

FIG. 9 shows an example of the impedance vs frequency response curves for two capacitor types as numbered in FIGS. 7 and 8 with and without via connections. It shows the resonance frequency shift resulting from the via connections.

Figure 10A:
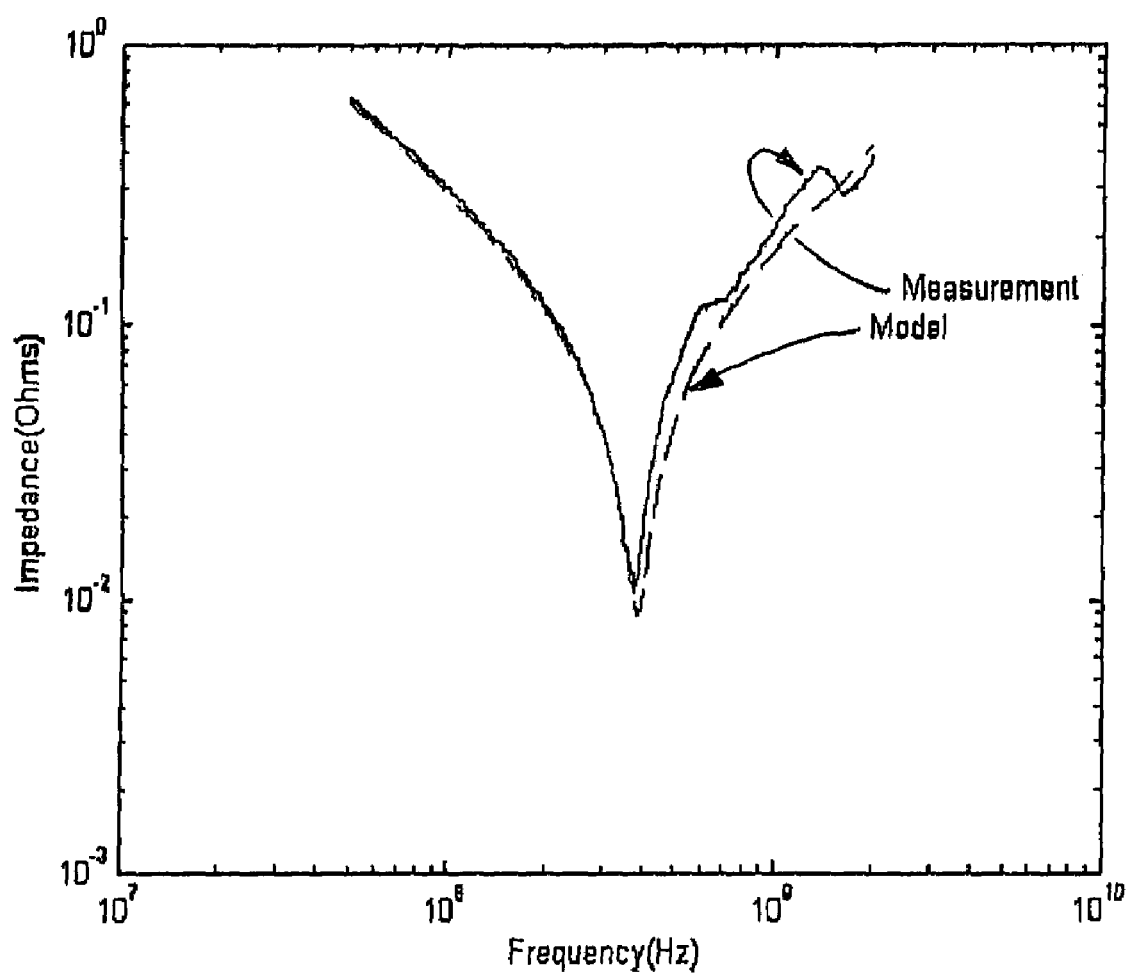
FIG. 10 is graphs of model to measurement correlations of capacitors 4 and 7.
Figure 10B:
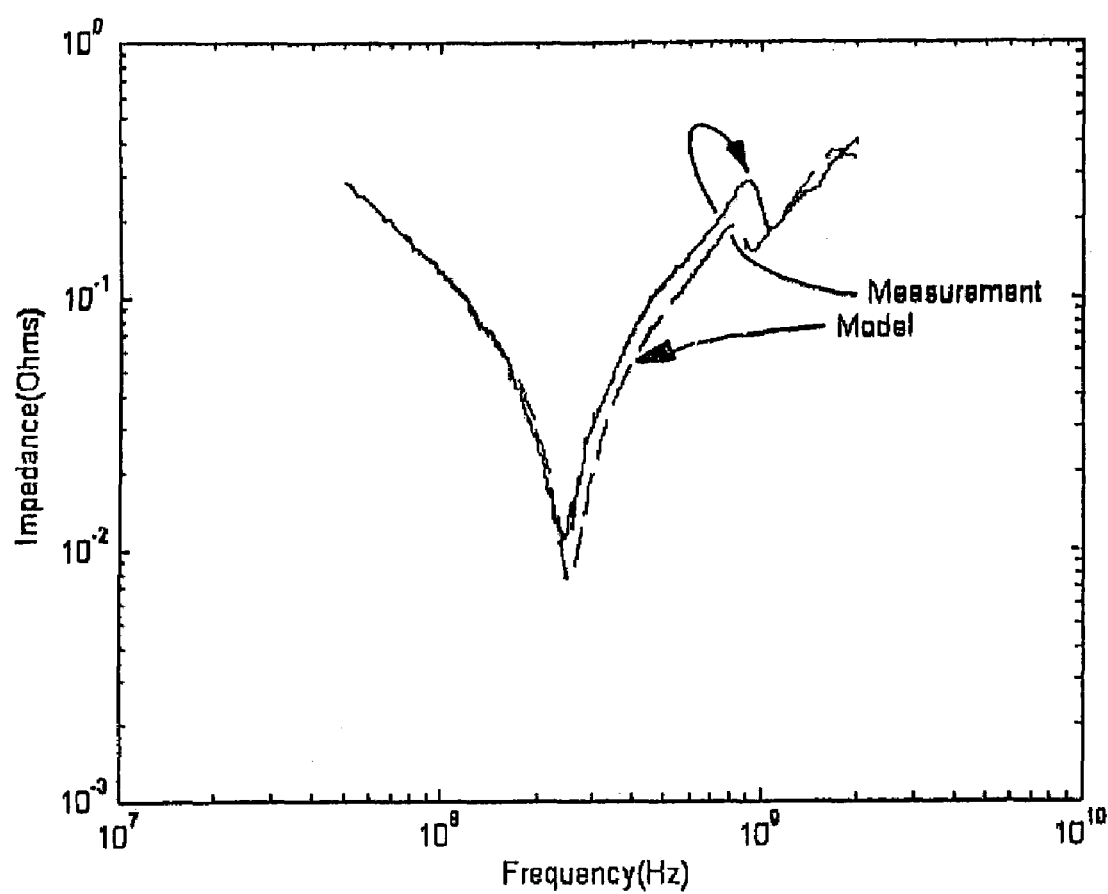

FIG. 10 shows the good correlation between the measured frequency response curves (solid line) and the modelled response curves (dashed line) for two capacitor types of different sizes.

Figure 11B:
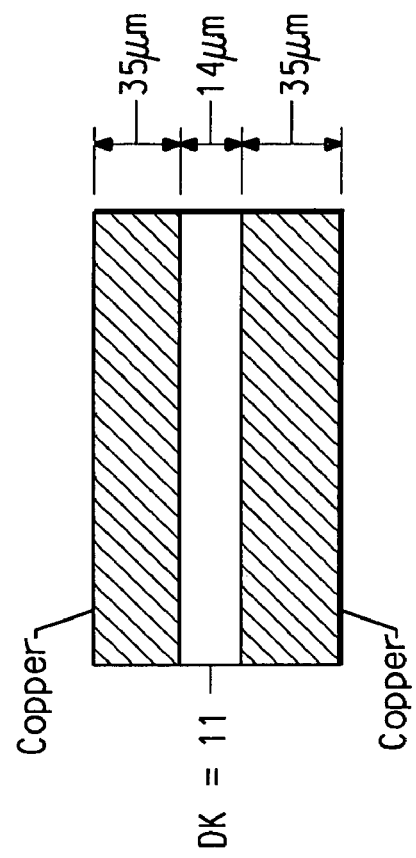
FIG. 11 is a planar capacitor illustration.
Figure 11A:
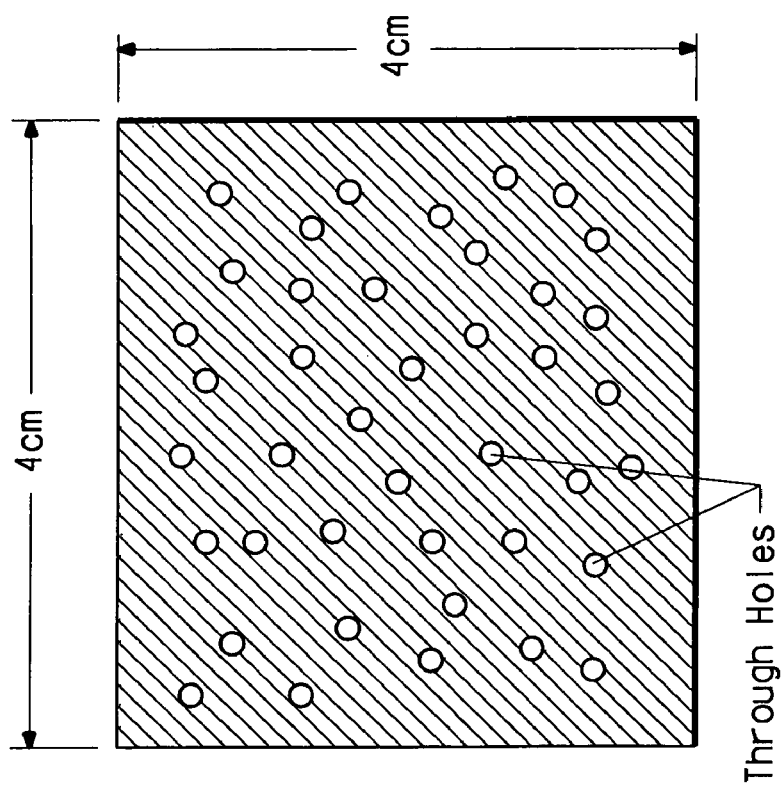

FIG. 11 illustrates the construction of a planar capacitor layer. Through-hole interconnections are indicated in the top-view.

Figure 12:
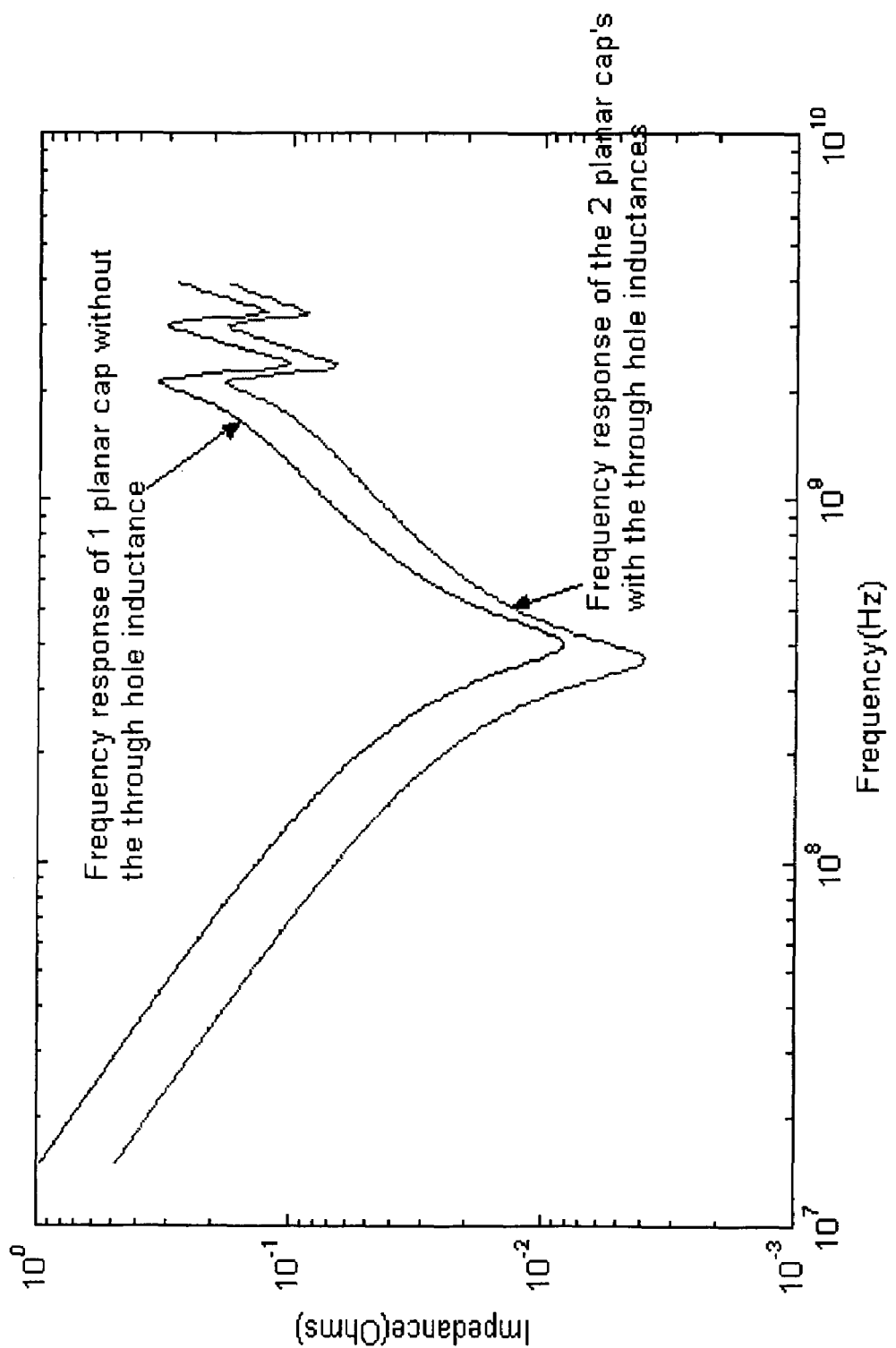
FIG. 12 is a graph modeling planar capacitor frequency response.

FIG. 12 shows the simulation of the planar capacitor impedance vs frequency response curve for the planar capacitor with and without the contribution of the through-hole inductance.

Figure 13:
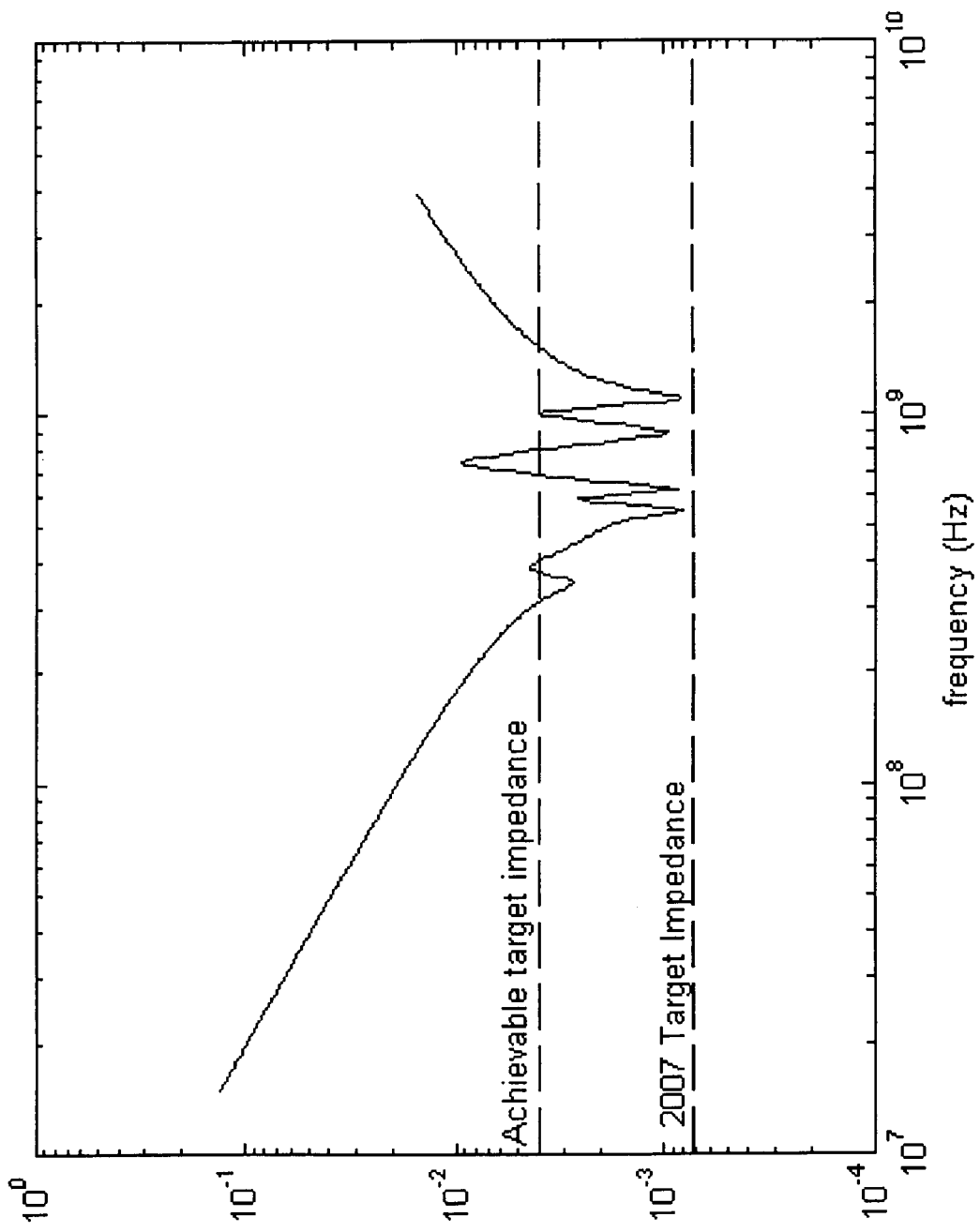
FIG. 13 shows target impedance with a capacitor array.

FIG. 13 shows the modelling result for an array of 64 discrete embedded capacitors applying the conservative design rule of a minimum spacing between capacitors of 500 μm. Capacitors of different sizes and different resonance freqencies were selected so that the capacitor array response curve yields fairly uniform, low impedance values in the mid-frequency range. A horizontal line indicates the achieved impedance in the 100 MHz to 1 GHz range and compares it with the lower impedance requirement of 0.7 mΩ derived from the ITRS roadmap for 2007.

Figure 14:
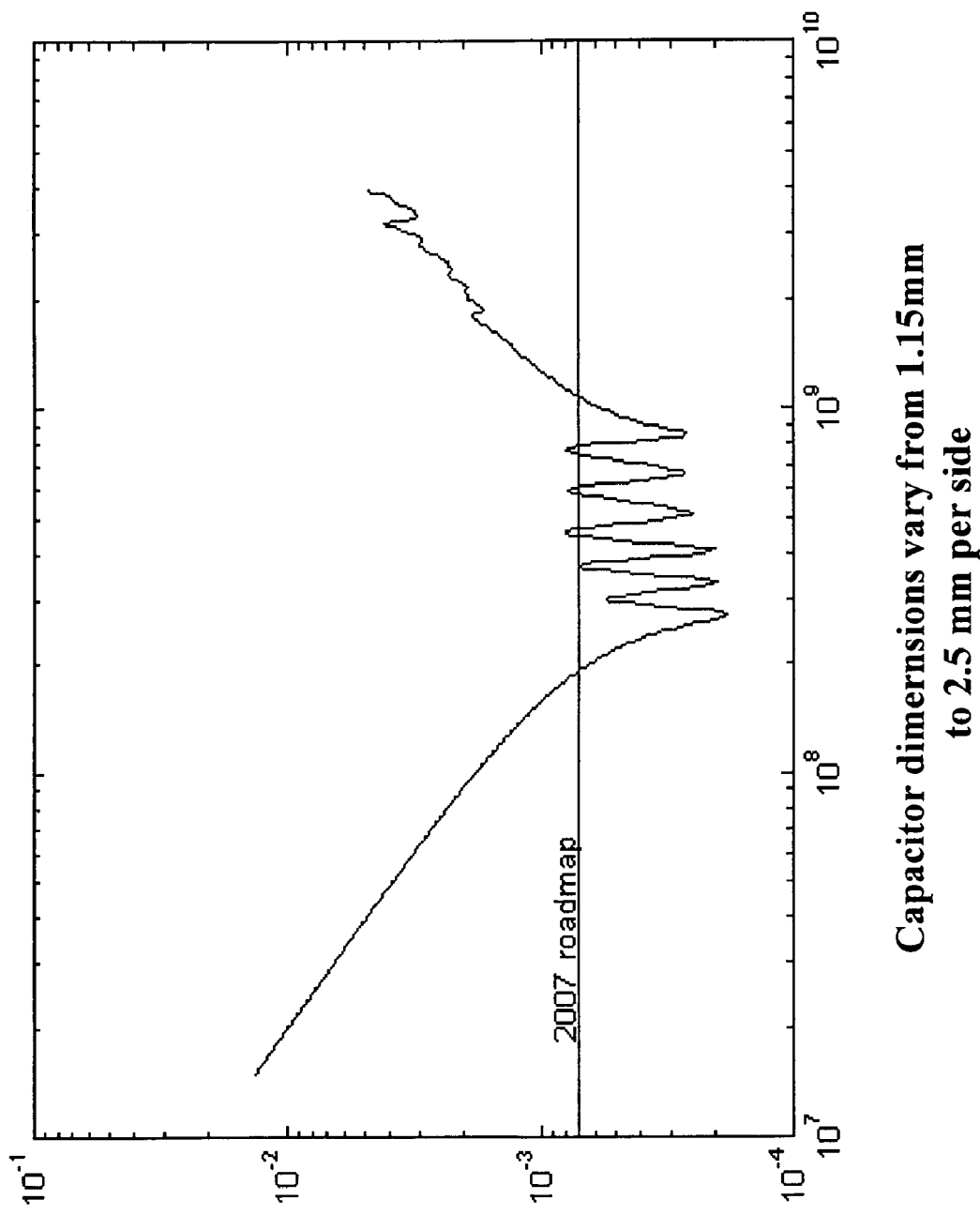
FIG. 14 shows target impedance with varying capacitor sizes.

FIG. 14 shows that by applying more demanding spacing design rules for an array of 1.15 to 2.5 mm$^2$ sized capacitors with optimized electrode area overlap, 2007 target impedance requirements are achieved in the mid-frequency range.

Figure 15A:
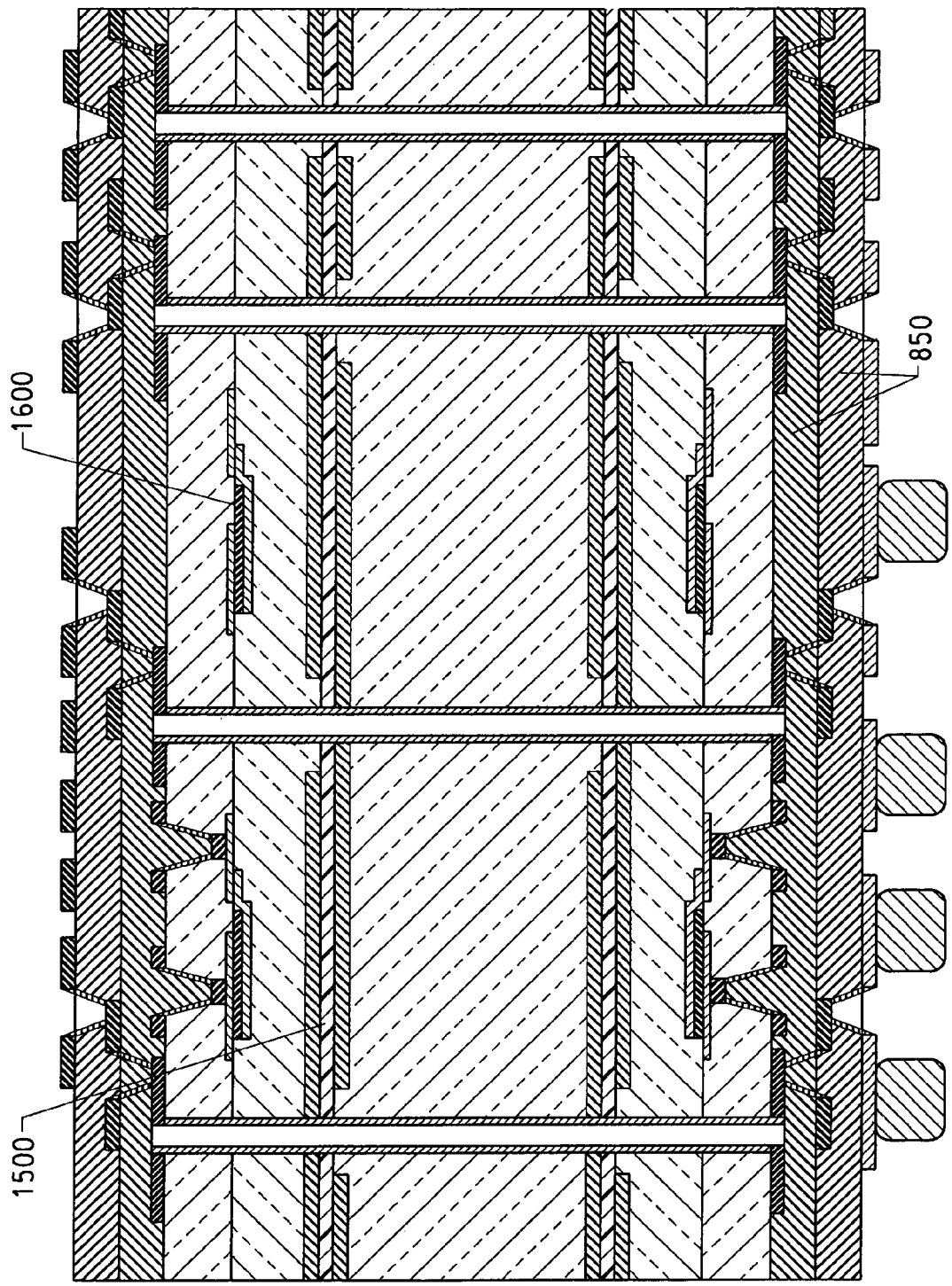

FIG. 15A depicts a representative package cross section showing the planar capacitor layers [1500], the discrete capacitors [1600] and the microvia layers [850] for interconnections to the discrete and planar capacitors.

Figure 15B:
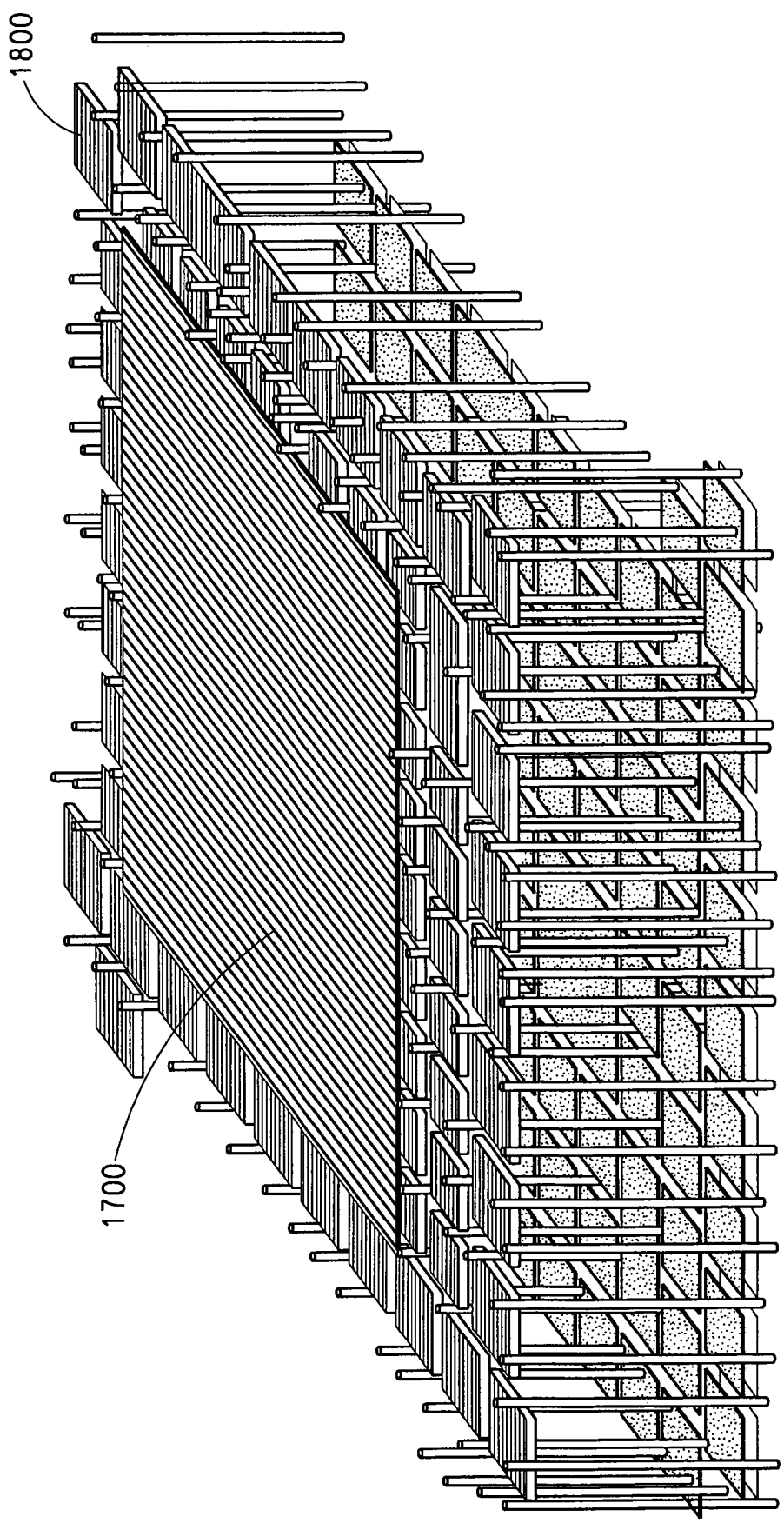

FIG. 15B shows an example of a capacitor array comprised of individual capacitors [1800] of various discrete capacitor sizes arranged in arrays with different locations with respect to the IC [1700] and through hole via connections.

Figure 17A:
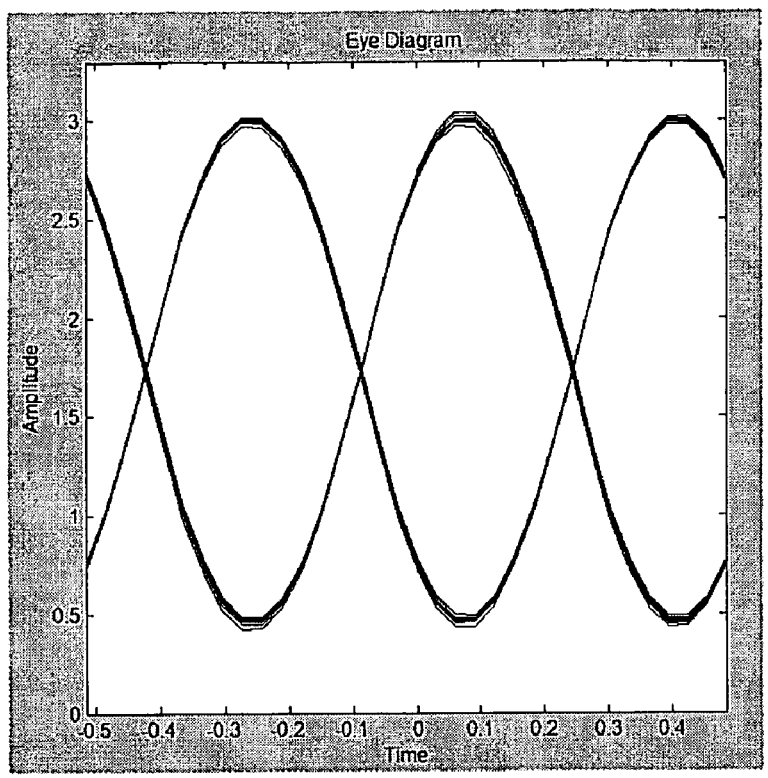
Figure 17B:
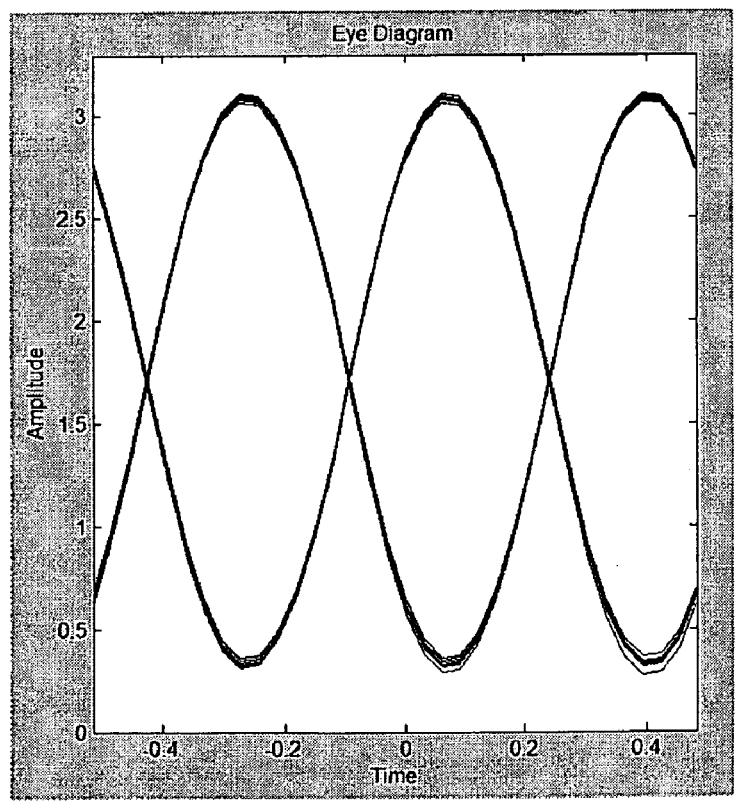

FIG. 16 describes the simulation model for 100 uncoupled transmission lines (2030) on a 38 micron thick substrate with a relative dielectric constant of 3.8 separated from a power plane (2000). The transmission lines are spaced 10 mils apart, are 15 mm long, 2.82 mils in width and each line is terminated with 99 ohm resistors (2040) to the power and ground planes (a 50 ohm line termination). In one case the power plane is on a 14 micron thick substrate opposite a ground plane (2010). The substrate has a relative dielectric constant of 3.8 and a Loss Tangent of 0.02. In another case the power plane is on a 14 micron thick substrate opposite the ground plane with a relative dielectric constant of 11 and a Loss Tangent of 0.02. Output drivers (2020) producing a 5 GHz square wave bit stream with 80 pS pulse width with 20 pS rise and fall times were used to drive all 100 transmission lines and the "eye" pattern response of a centrally located transmission line was obtained. FIG. 17A shows the eye pattern for the first case, a power plane substrate with a dielectric constant of 3.8, where the eye opening height is 2.4799V. FIG. 17B shows the response for the second case with the same conditions and a power plane substrate with a dielectric constant of 11. The eye opening height is 2.6929V, a significant improvement over the first case. The spacing between the lines was changed to 3 mils resulting in 50 coupled line pairs. With all other conditions remaining the same the eye pattern response was obtained. FIG. 18A shows the response for the case where the where the power plane substrate dielectric constant is 3.8 and FIG. 18B shows the response for a power plane substrate dielectric constant of 11. The higher dielectric constant power plane substrate results in an improved eye pattern response.

FIG. 19 shows the simulation model for a configuration that includes discrete decoupling capacitors in addition to the planar power plane substrates for the analysis of simultaneous switching noise (SSN). This simulation model had 50 coupled transmission line (2230) pairs on a 38 micron thick substrate with a relative dielectric constant of 3.8 separated from a power plane (2200). The transmission lines are spaced 3 mils apart, are 15 mm long, 2.82 mils in width and each line is terminated with 99 ohm resistors (2240) to the power and ground planes (a 50 ohm line termination). In some cases the power plane is on a 14 micron thick substrate opposite a ground plane (2210). The substrate has a relative dielectric constant of 3.8 and a Loss Tangent of 0.02. In other cases the power plane is on a 14 micron thick substrate opposite the ground plane with a relative dielectric constant of 11 and a Loss Tangent of 0.02. Output drivers (2220) producing a 5 GHz square wave bit stream with 80 pS pulse width with 20 pS rise and fall times was used to drive all 100 transmission lines simultaneously and the noise voltage produced on the power plane was obtained. Variations in the type, SMT or embedded discrete, and quantity of capacitors were analyzed. The capacitors were located in an area (2260) at the driver or near end of the transmission lines.

FIG. 20 is a top view of a configuration depicting 50 pairs of coupled lines (2300), 100 lines total. Twenty five SMT capacitors were placed at the driver end of the transmission line at every other line pair starting at line pair 1 (2310) the next at line pair 3 (2320) and ending at line pair 50 (2330). The planar power plane substrate had a dielectric constant of 3.8. Each capacitor had a capacitance of 100 nF, an equivalent series inductance (ESL) of about 205 pH and an equivalent series resistance (ESR) of 100 milliohms. A 5 GHz square wave bit stream with 80 pS pulse width with 20 pS rise and fall times was used to drive all 100 transmission lines simultaneously and the noise voltage on the power plane was measured. This was repeated for embedded discrete capacitors where each capacitor had a capacitance of 1 nF, an equivalent series inductance (ESL) of about 33 pH and an equivalent series resistance (ESR) of 9 milliohms. The planar power plane substrate in this configuration had a dielectric constant of 11. FIG. 21A shows the voltage variation on the power plane for the 25 SMT capacitors with a planar power plane substrate dielectric constant of 3.8. FIG. 21B shows the voltage variation on the power plane for the 25 embedded discrete capacitors with a planar power plane substrate dielectric constant of 11. A significant reduction in power plane noise produced by the simultaneous switching of output drivers resulted from the use of embedded capacitors and a higher dielectric constant planar power plane substrate.

Additional SMT capacitors were added to the model to determine the number of SMT capacitors that would provide the equivalent noise reduction of the embedded capacitor configuration. Fifty, seventy-five and one hundred SMT capacitors were modeled. The fifty capacitor configuration was achieved by placing capacitors at the driver end of every line pair. The seventy-five capacitor configuration was achieved by adding a second column of capacitors at every other line pair and the one hundred capacitor configuration was achieved by adding capacitors to produce a two by fifty array as shown in FIG. 22. In this figure the transmission line pairs (2400) have capacitors at the driver end of the first pair (2410) thru 50$^{th}$ pair (2420) of transmission lines.

FIG. 23A shows the voltage variation on the power plane for fifty SMT capacitors and a planar substrate dielectric constant of 3.8. FIG. 23B shows the voltage variation on the power plane for seventy-five SMT capacitors and a planar substrate dielectric constant of 3.8 and FIG. 23C shows the voltage variation on the power plane for one hundred SMT capacitors and a planar substrate dielectric constant of 3.8. All four of the SMT capacitor configurations result in higher power plane noise as a result of simultaneous switching of output drivers than the embedded discrete capacitor configuration with twenty-five capacitors and a power plane dielectric constant of 11 as shown in FIG. 21B.

"Die shadow" is defined as the area of the package projected under the footprint of a semiconductor die as viewed from the top. FIG. 24 is a top or plan view of a die (2910) on a package (2900). The core logic section of the die is typically shown as the solid area 2920 and the input/output circuits of the die are typically located around the perimeter of the die in the shaded area (2930). The "die shadow" in this example would be the projection of the area defined by 2910 on lower layers. FIG. 25 is a cross section view of a die (2800) mounted using solder balls (2810) on a portion of a package substrate. The package substrate may consist of multiple layers such as 2820 and 2830 where these layers may be a dielectric interconnecting layer or a capacitor layer. (See FIG. 1 also) The area 2840 on the capacitor layers beneath the die is the area of the "die shadow" the preferred location of capacitors for core logic or I/O decoupling capacitors.

What is claimed is:

1. A device with a package that provides a low noise power supply to an integrated circuit comprising:
    a plurality of prepreg layers,
        at least one patterned metal layer built over one of said prepreg layers,
    a semiconductor die having input/output power supply terminals electrically connected to one of said at least one patterned metal layer,
    a layer of discrete ceramic capacitors embedded between two of said prepreg layers, each of said discrete ceramic capacitors in said layer comprising a dielectric between opposing electrodes, the electrodes of said discrete ceramic capacitors being electrically connected to one of said at least one patterned metal layer by conductive vias formed through at least one prepreg layer,
    said layer of discrete ceramic capacitors including a first array of discrete ceramic capacitors wherein the discrete ceramic capacitors of said first array are located within the perimeter of the shadow of the semiconductor die or partially within the perimeter of the shadow of the semiconductor die, and wherein the first array of discrete ceramic capacitors
        includes capacitors having electrodes of multiple shapes and sizes,
        includes capacitors having electrodes with different numbers of vias and arrangements of vias interconnecting the capacitor electrodes to one of said at least one patterned metal layer, and
        includes capacitors having different resonance frequencies.

2. The device of claim 1 wherein the discrete ceramic capacitors of said first array of discrete ceramic capacitors are arranged in such a way that the capacitor array's impedance versus frequency curve yields impedance values at or below a targeted impedance value.

3. The device of claim 1 where said discrete ceramic capacitors are fabricated using technology selected from thick film, thin film and combinations thereof.

4. The device of claim 1 further comprising at least one planar capacitor embedded between two of said prepreg layers, wherein said discrete capacitors of said first array of discrete ceramic capacitors are each connected in parallel to one of said at least one planar capacitor through said at least one patterned metal layer.

5. The device of claim 1 wherein the discrete ceramic capacitors of said first array of discrete ceramic capacitors each have a dielectric comprised of the same material.

6. The device of claim 5 wherein the discrete ceramic capacitors of said first array of discrete ceramic capacitors each have an electrode comprised of metal foil.

7. The device of claim 6 wherein the discrete ceramic capacitors of said first array of discrete ceramic capacitors each have a copper foil electrode.

8. The device of claim 1 wherein the first array of discrete ceramic capacitors includes capacitors having different levels of capacitance.

9. The device of claim 1 wherein the first array of discrete ceramic capacitors includes capacitors and associated via interconnections having different levels of equivalent series inductance.

10. The device of claim 1 wherein the first array of discrete ceramic capacitors includes capacitors and associated via interconnections having different levels of equivalent series resistance.

11. The device of claim 1 further comprising
    a second layer of discrete ceramic capacitors embedded between two of said prepreg layers, each of said discrete ceramic capacitors in said second layer of discrete ceramic capacitors comprising a dielectric between opposing electrodes, the electrodes of said discrete ceramic capacitors being electrically connected to one of said at least one patterned metal layer by conductive vias formed through at least one prepreg layer,
    said second layer of discrete ceramic capacitors including a second array of discrete ceramic capacitors wherein the discrete ceramic capacitors of said second array are located within the perimeter of the shadow of the semiconductor die or partially within the perimeter of the shadow of the semiconductor die, and wherein the second array of discrete ceramic capacitors
        includes capacitors having electrodes of multiple shapes and sizes,
        includes capacitors having electrodes with different numbers of vias and arrangements of vias interconnecting the capacitor electrodes to one of said at least one patterned metal layer, and
        includes capacitors having different resonance frequencies.

12. The device of claim 11 further comprising at least one planar capacitor embedded between two of said prepreg layers, wherein said discrete capacitors of said first and second arrays of discrete ceramic capacitors are each connected in parallel to one of said at least one planar capacitor through one of said at least one patterned metal layer.

13. The device of claim 11 wherein the first array of discrete ceramic capacitors includes capacitors and associated via interconnections having different levels of equivalent series inductance, and wherein the second array of discrete ceramic capacitors includes capacitors and associated via interconnections having different levels of equivalent series inductance.

* * * * *